United States Patent
Park et al.

(10) Patent No.: US 12,113,159 B2
(45) Date of Patent: Oct. 8, 2024

(54) DUAL EMISSION LED CHIP

(71) Applicant: NANO-X, Osan-si (KR)

(72) Inventors: Du Jin Park, Yongin-si (KR); Pil Kuk Jang, Seoul (KR)

(73) Assignee: NANO-X, Osan-si (KR)

( * ) Notice: Subject to any disclaimer, the term of this patent is extended or adjusted under 35 U.S.C. 154(b) by 537 days.

(21) Appl. No.: 17/419,623

(22) PCT Filed: Dec. 31, 2019

(86) PCT No.: PCT/KR2019/018807
§ 371 (c)(1),
(2) Date: Jun. 29, 2021

(87) PCT Pub. No.: WO2020/141861
PCT Pub. Date: Jul. 9, 2020

(65) Prior Publication Data
US 2022/0085262 A1    Mar. 17, 2022

(30) Foreign Application Priority Data

Dec. 31, 2018   (KR) .................. 10-2018-0174265
Jan. 4, 2019    (KR) .................. 10-2019-0001089

(51) Int. Cl.
*H01L 33/62*    (2010.01)
*H01L 33/00*    (2010.01)
(Continued)

(52) U.S. Cl.
CPC ............ *H01L 33/62* (2013.01); *H01L 33/007* (2013.01); *H01L 33/0093* (2020.05);
(Continued)

(58) Field of Classification Search
CPC ... H01L 33/62; H01L 33/007; H01L 33/0093; H01L 33/0095; H01L 33/24;
(Continued)

(56) References Cited

U.S. PATENT DOCUMENTS

| | | | |
|---|---|---|---|
| 5,156,979 A * | 10/1992 | Sato ...................... | H01L 31/115 438/96 |
| 2002/0149015 A1 * | 10/2002 | Choi ...................... | H01L 33/24 257/E27.12 |
| 2007/0295973 A1 * | 12/2007 | Jinbo .................. | H01L 27/1266 257/88 |
| 2008/0012027 A1 * | 1/2008 | Honda ................. | C09K 11/574 257/79 |

(Continued)

FOREIGN PATENT DOCUMENTS

| CN | 205944139 U | 2/2017 |
|---|---|---|
| JP | 2005-347677 A | 12/2005 |

(Continued)

*Primary Examiner* — S M Sohel Imtiaz
(74) *Attorney, Agent, or Firm* — NKL Law; Jae Youn Kim

(57) ABSTRACT

Proposed is a dual emission LED chip that emits light to the upper and lower sides of a PN junction, wherein the duel emission LED chip uses the electroluminescent effect of the PN junction including a P layer and an N layer provided below the P layer, and characterized in that the dual emission LED chip emits light in the upward direction of the P layer and the downward direction of the N layer. The dual emission chip can be applied as a single chip to a field requiring dual emission, thereby enabling miniaturization of applied equipment, and increases power efficiency, thereby reducing manufacturing costs. In addition, as the dual emission LED chip can be manufactured through a batch process, a separate packaging process is not required.

10 Claims, 25 Drawing Sheets

(51) Int. Cl.
    *H01L 33/24*     (2010.01)
    *H01L 33/08*     (2010.01)
    *H01L 33/32*     (2010.01)
    *H01L 33/38*     (2010.01)
    *H01L 33/44*     (2010.01)

(52) U.S. Cl.
    CPC .......... H01L 33/0095 (2013.01); H01L 33/24 (2013.01); *H01L 33/0008* (2013.01); *H01L 33/08* (2013.01); *H01L 33/32* (2013.01); *H01L 33/382* (2013.01); *H01L 33/44* (2013.01); *H01L 2933/0016* (2013.01); *H01L 2933/0025* (2013.01); *H01L 2933/0066* (2013.01)

(58) Field of Classification Search
    CPC ..... H01L 33/0008; H01L 33/08; H01L 33/32; H01L 33/382; H01L 33/44; H01L 2933/0016; H01L 2933/0025; H01L 2933/0066; H01L 21/027; H01L 33/20; H01L 33/387; H01L 33/58

See application file for complete search history.

(56) References Cited

U.S. PATENT DOCUMENTS

| | | | |
|---|---|---|---|
| 2009/0026453 A1* | 1/2009 | Yamazaki | G02F 1/1368 |
| | | | 257/E33.001 |
| 2017/0222088 A1 | 8/2017 | Klemp | |
| 2017/0294480 A1* | 10/2017 | Kwon | H01L 27/14627 |
| 2020/0161340 A1* | 5/2020 | Jintyou | H01L 33/62 |

FOREIGN PATENT DOCUMENTS

| | | | | |
|---|---|---|---|---|
| JP | 2013522871 A | 6/2013 | | |
| JP | 2013526052 A | 6/2013 | | |
| JP | 2016025205 A | 2/2016 | | |
| JP | 2016039365 A | 3/2016 | | |
| KR | 10-0828351 B1 | 5/2008 | | |
| KR | 10-2008-0075368 A | 8/2008 | | |
| KR | 20080075368 A | * | 8/2008 | .......... H01L 33/382 |
| KR | 10-2012-0040972 A | 4/2012 | | |
| KR | 10-2013-0009373 A | 1/2013 | | |
| KR | 10-1342418 B1 | 12/2013 | | |

* cited by examiner

S100

S210

S220

S230

S240

S252

S253

S254

S300

S400

S500

S610

S620

DUAL EMISSION LED CHIP

TECHNICAL FIELD

The present invention relates to a light-emitting diode (LED) chip which emits light through two surfaces thereof. Specifically, the present invention relates to a dual emission LED chip that is a single LED chip configured to emit light upward and downward.

BACKGROUND ART

The conventional light-emitting diode (LED) chips emit light in only one direction with respect to a P-N junction. Therefore, in order to emit light through two surfaces using the conventional LED chip, the LED chip should be mounted on each of the two surfaces, and in this case, there are problems in that a thickness becomes thicker, a lot of power is consumed, and manufacturing costs are increased.

RELATED ART DOCUMENTS

Patent Documents

Related Art Document 1: Korean Patent Publication No. 10-2012-0040972 (published on Apr. 30, 2012)
Related Art Document 2: Korean Patent Registration No. 10-1342418 (registered on Dec. 11, 2013)

DISCLOSURE

Technical Problem

The present invention is directed to providing a structure of a light-emitting diode (LED) chip which emits light through two surfaces thereof.

The present invention is also directed to providing a method of manufacturing a dual emission LED chip.

Technical Solution

According to an embodiment of the present invention, a dual emission light-emitting diode (LED) chip includes an LED chip which uses an electroluminescence effect of a P-N junction including a P-layer (P) and an N-layer (N) provided below the P-layer (P), wherein light is emitted in each of an upward direction of the P-layer (P) and a downward direction of the N-layer (N).

Advantageous Effects

According to the present invention, since a dual emission light-emitting diode (LED) chip is applicable as a single chip to a field requiring double-sided emission, an application apparatus can be miniaturized, power efficiency can be increased, and manufacturing costs can be reduced.

In addition, since the dual emission LED chip manufactured according to the present invention can be manufactured through a batch process, a separate packaging process is not required.

Furthermore, in the dual emission LED chip according to the present invention, the total internal reflection of light generated by an LED is reduced to increase luminous efficiency.

BEST MODE OF THE INVENTION

Figure 1:
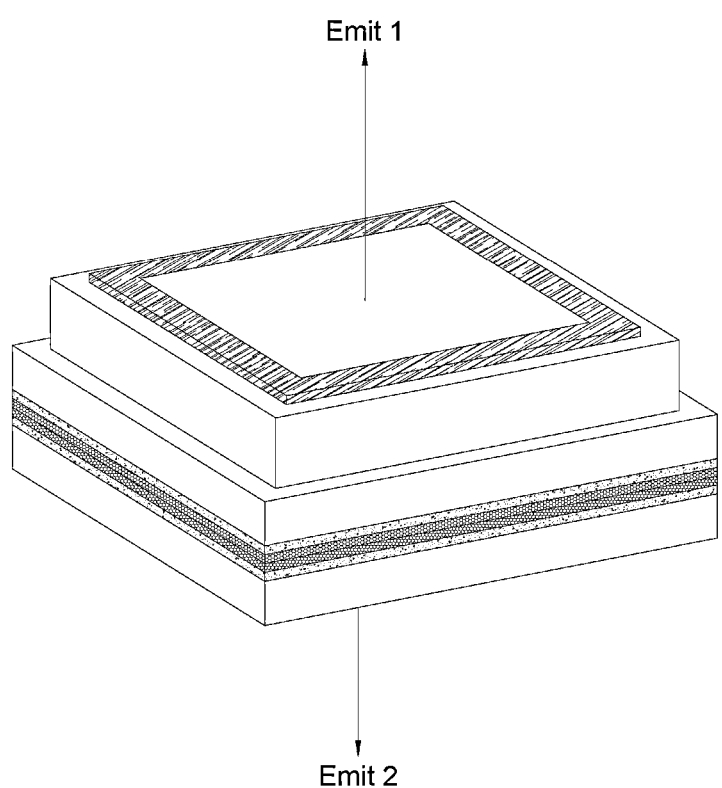
FIG. 1 is a perspective view illustrating a dual emission light-emitting diode (LED) chip according to a first embodiment of the present invention.

In a light-emitting diode (LED) chip using an electroluminescence effect of a P-N junction 10 including a P-layer P and an N-layer N provided below the P-layer P, a dual emission LED chip emits light in an upward direction of the P-layer P and a downward direction of the N-layer N.

MODES OF THE INVENTION

The terms used in the present specification will be briefly described, and embodiments of the present invention will be described in detail. Terms used in the present invention are selected from general terms currently widely used in consideration of functions in the present invention, but the terms may vary according to the intention of those skilled in the art, precedents, or new technology. Also, specified terms are selected arbitrarily by the applicant, and in this case, the detailed meaning thereof will be described in the detailed description of the invention. Thus, the terms used in the present specification should be defined based on not simple names but the meaning of the terms and the overall description of the present invention.

Prior to describing the present invention in detail, in the present specification, an "upper side" refers to an upward direction in the accompanying drawings, and a "lower side" refers to a downward direction in the drawings.

Hereinafter, embodiments according to the present invention will be described in detail with reference to the accompanying drawings.

FIG. 1 is a perspective view illustrating a dual emission light-emitting diode (LED) chip according to a first embodiment of the present invention.

The dual emission LED chip according to the present invention has emission surfaces in an upward direction and a downward direction, and the shape of the emission surface may vary according to design. In the present embodiment, description will be made based on that the dual emission LED chip has a quadrangular emission surface. According to the present invention, the dual emission LED chip emits light from two surfaces thereof through upward emission Emit 1 and downward emission Emit 2 in a direction perpendicular to one surface.

Figure 2:
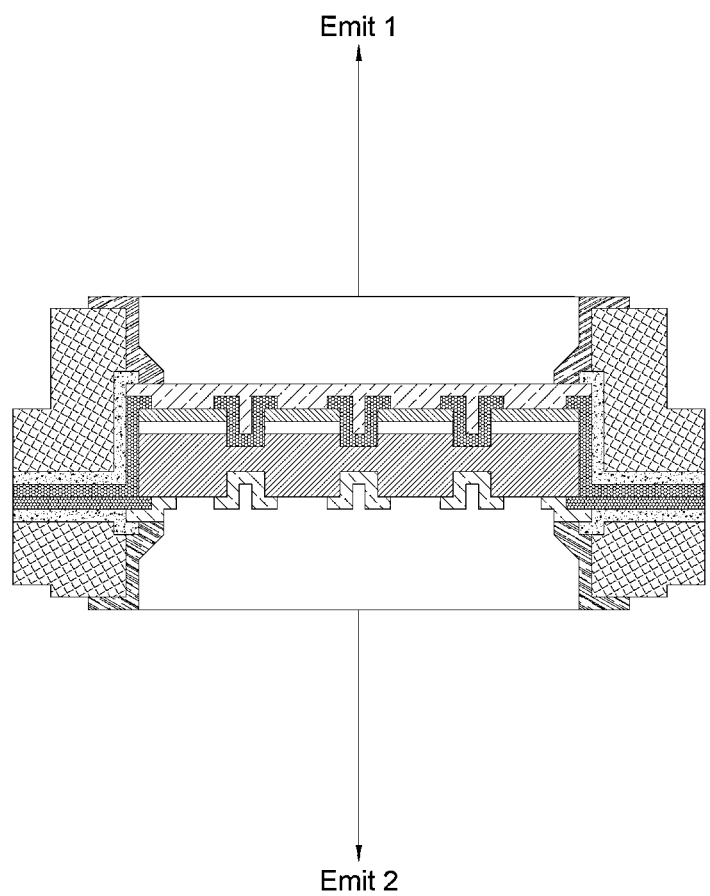
FIG. 2 is a cross-sectional view illustrating the dual emission LED chip according to the first embodiment of the present invention.

FIG. 2 is a cross-sectional view illustrating the dual emission LED chip according to the first embodiment of the present invention. The dual emission LED chip according to the present invention is provided by stacking a P-type semiconductor, an N-type semiconductor, an electrode, and the like.

Hereinafter, a structure of the dual emission LED chip according to the first embodiment of the present invention will be described in detail with reference to FIGS. 3 to 9.

Figure 3:
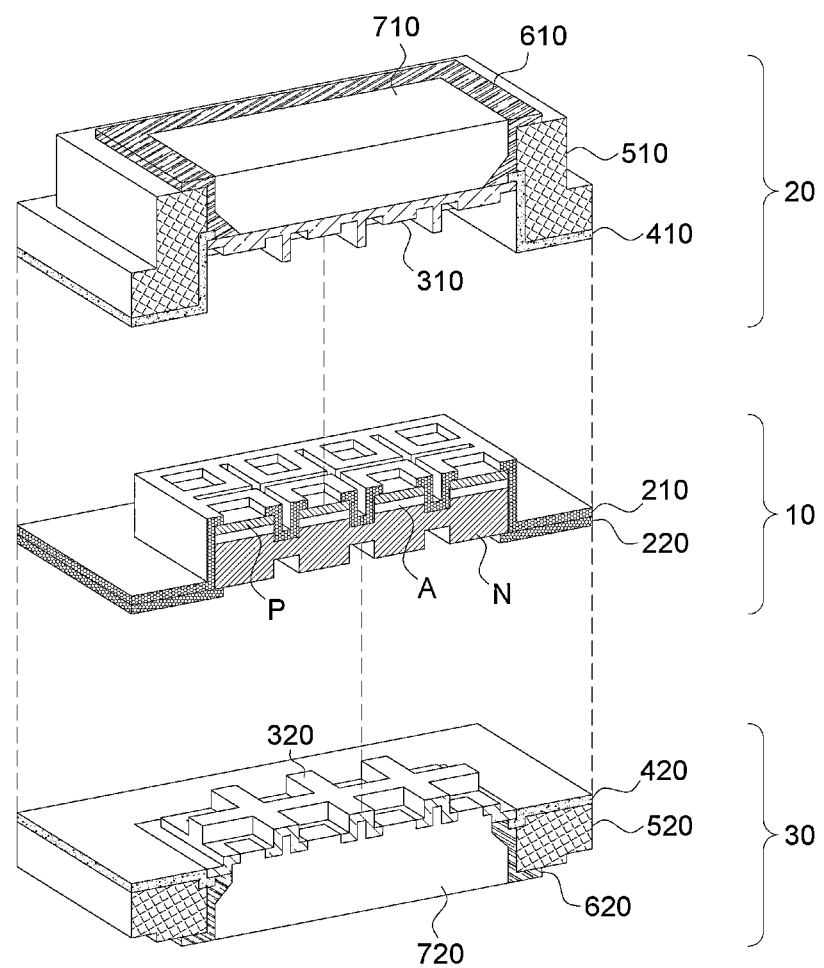
FIG. 3 is a perspective view illustrating the dual emission LED according to the first embodiment of the present invention, which is separated and vertically cut.

FIG. 3 is a perspective view illustrating the dual emission LED according to the first embodiment of the present invention, which is separated and vertically cut. The dual emission LED chip according to the present invention includes a P-N junction 10, a P-direction connection unit 20, and an N-direction connection unit 30. Hereinafter, the P-N junction 10 will be described in detail with reference to FIG. 4, the P-direction connection unit 20 will be described in detail with reference to FIG. 5, and the N-direction connection unit 30 will be described in detail with reference to FIG. 6.

Figure 4:
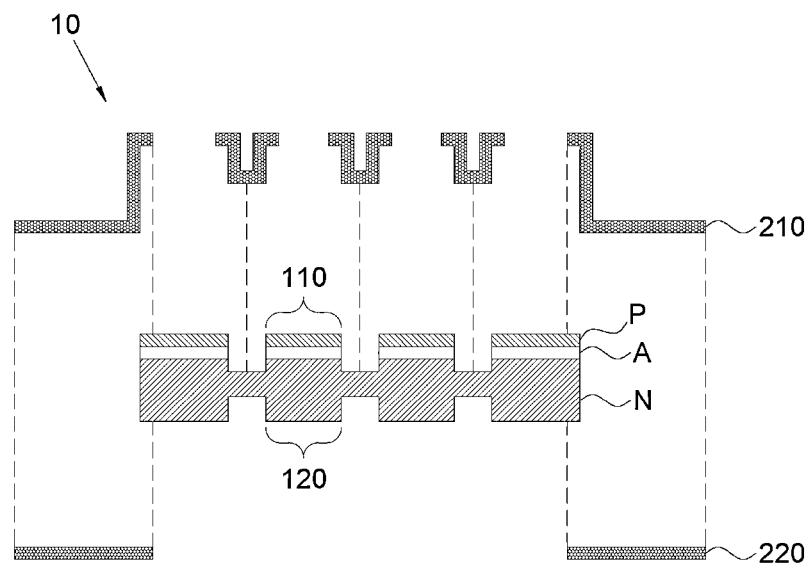
FIG. 4 is a cross-sectional view illustrating a P-N junction according to the first embodiment of the present invention.

FIG. 4 is a cross-sectional view illustrating the P-N junction 10 according to the first embodiment of the present invention. The P-N junction 10 includes a P-layer P, an active layer A, and an N-layer N and is a component which emits light using an electroluminescent effect. Specifically, the P-N junction 10 includes the N-layer N which is formed of an N-type semiconductor and has a predetermined first thickness, the active layer A which is provided on an upper surface of the N-layer N and has a predetermined second thickness, and the P-layer P which is formed of a P-type semiconductor on an upper surface of the active layer A and has a predetermined third thickness.

The P-layer P is a layer formed of the P-type semiconductor in which holes are used as charge carriers, and a material thereof may vary according to optical characteristics of a target LED chip. In the present description, description will be made based on P-GaN.

The active layer A is a layer in which electrons and holes combine to emit light, and in the present description, description will be made based on that the active layer A is formed as an InGaN or GaN-layer.

The N-layer N is a layer formed of the N-type semiconductor in which free electrons are used as charge carriers, and a material thereof may vary according to optical characteristics of a target LED chip. In the present description, description will be made based on N-GaN.

Meanwhile, heat as well as a luminous effect is generated in the P-N junction 10. Therefore, in order to facilitate heat radiation by increasing a surface area of each layer, the P-N junction 10 may be provided as a mesa structure. Here, the "mesa structure" refers to a structure in which a surface of each layer is engraved to as much as a predetermined depth to form a plurality of islands, and an edge of each island is provided as a vertical cliff or slope. According to the first embodiment of the present invention, the P-N junction includes a P-direction mesa structure (PMS) formed on a surface of the P-layer and an N-direction mesa structure (NMS) formed on a surface of the N-layer.

The PMS is a mesa structure formed by engraving the P-layer P from an upper surface of the P-layer P to a predetermined depth of the N-layer N, and a plurality of P-direction islands 110 are formed therein. The number of P-direction islands 110 may vary according to design. Since the PMS is formed by engraving the P-layer P from the upper surface of the P-layer P to the predetermined depth of the N-layer N through the active layer A, heat generated in each layer can be efficiently dissipated.

The NMS is a mesa structure formed by engraving the N-layer N to a predetermined depth from a lower surface of the N-layer N, and a plurality of N-direction islands 120 are formed therein. The number of N-direction islands 120 may vary according to design. Since the N-layer N is generally provided to be thicker than the P-layer P, the NMS is formed only in the N-layer N.

In addition, when a member made of a metal is bonded to a side surface of the P-N junction 10 and a side surface of the PMS, since electric charges do not move through the P-layer P, the active layer A, and the N-layer and move through the member, there is a problem in that a normal function of the LED chip may be disturbed. In order to prevent the problem, a P-direction insulating part 210 and an N-direction insulating part 220 may be provided.

The P-direction insulating part 210 is a film-shaped component provided on an outer surface of the P-N junction 10 and an outer surface of the PMS. Silicon dioxide ($SiO_2$) or silicon nitride ($SiN_x$) may be used as a material of the P-direction insulating part 210.

The N-direction insulating part 220 is a film-shaped component provided in contact with a lower surface of the P-direction insulating part 210 to insulate an edge of the N-layer N. Silicon dioxide ($SiO_2$) or silicon nitride ($SiN_x$) may be used as a material of the N-direction insulating part 220.

Since the P-direction insulating part 210 and the N-direction insulating part 220 are provided in contact with each other, the P-N junction 10 is insulated such that only the upper surface of the P-layer P and the upper surface of the N-layer N are exposed.

Figure 5:
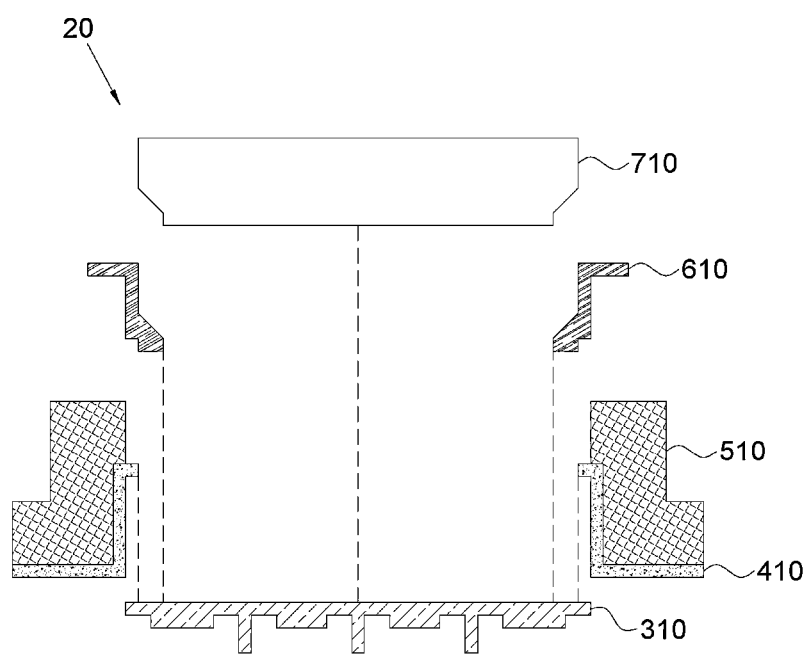
FIG. 5 is a cross-sectional view illustrating a P-direction emission unit according to the first embodiment of the present invention.

FIG. 5 is a cross-sectional view illustrating the P-direction connection unit 20 according to the first embodiment of the present invention. The P-direction connection unit 20 is a component provided on the upper surface of the P-layer P to connect an electrode to the P-layer P, protect an upper surface of the P-N junction 10, and convert a P-direction emission color. Specifically, the P-direction connection unit 20 includes a P-direction ohmic contact electrode 310, a P-connection electrode 610, and a P-direction encapsulant layer 710.

The P-direction ohmic contact electrode 310 is a component for forming an ohmic contact with the P-layer P. Specifically, the P-direction ohmic contact electrode 310 is deposited to as much as a predetermined thickness and formed on the upper surface of the P-layer P and an upper surface of the P-direction insulating part 210 and forms an ohmic contact with each P-direction island 110. Indium tin oxide (ITO), a NiAu alloy, a NiPt alloy, or the like may be used for the P-direction ohmic contact electrode 310 according to the present embodiment.

The P-direction encapsulant layer 710 is a component which protects the upper surface of the P-N junction 10 and converts the P-direction emission color. Specifically, the P-direction encapsulant layer 710 is provided on an upper surface of the P-direction ohmic contact electrode 310 to convert a color of transmitted light. However, since the P-connection electrode 610 should be connected to the P-direction ohmic contact electrode 310, the P-direction encapsulant layer 710 is provided on the upper surface of the P-direction ohmic contact electrode 310 and is formed to expose an edge of the upper surface of the P-direction ohmic contact electrode 310. A material of the P-direction encapsulant layer 710 may be a mixture of a general phosphor and silicon, silicon, a phosphor in glass (PIG), or a remote phosphor.

The P-connection electrode 610 is a component which is connected to the P-direction ohmic contact electrode 310 to serve as an anode. Specifically, the P-connection electrode is provided to surround a side surface of the P-direction encapsulant layer 710 and is connected to the upper surface edge of the P-direction ohmic contact electrode 310. In addition, the P-connection electrode 610 serves as a reflector to prevent light from escaping through the side surface of the P-direction encapsulant layer 710. One selected from among alloys and metals such as titanium (Ti)/silver (Ag), Ti/aluminum (Al), Ti/gold (Au), Ag, Al, copper (Cu), nickel (Ni), Ti/Al/Ni/Au, and Cr/Ni/Au may be used as a material of the P-connection electrode 610.

Meanwhile, since the P-N junction 10, the P-direction ohmic contact electrode 310, and the P-direction encapsulant layer 710 are easily damaged due to the characteristics of the materials thereof, and the P-connection electrode 610 is thinly provided, there is a problem in that the P-connection electrode 610 does not serve to protect the P-direction encapsulant layer 710. In order to solve the problem, the P-direction connection unit 20 may include a P-direction support metal part 510. Specifically, the P-direction support metal part 510 is provided on outer surfaces of the P-direction insulating part 210, the P-direction ohmic contact electrode 310, and the P-connection electrode 610 to protect structures of P-N junction 10 and the P-direction connection unit 20. Any one selected from among metals such as Cu, CuW, Ni, and Au may be used for the P-direction support metal part 510.

In addition, a P-direction seed metal 410 may be provided to form the P-direction support metal part 510. Specifically, the P-direction seed metal 410 may be provided as a thin film to be applied on the outer surfaces of the P-direction insulating part 210 and the P-direction ohmic contact electrode 310 so that the P-direction support metal part 510 may be formed through an electrolytic plating process using the P-direction seed metal 410.

Figure 6:
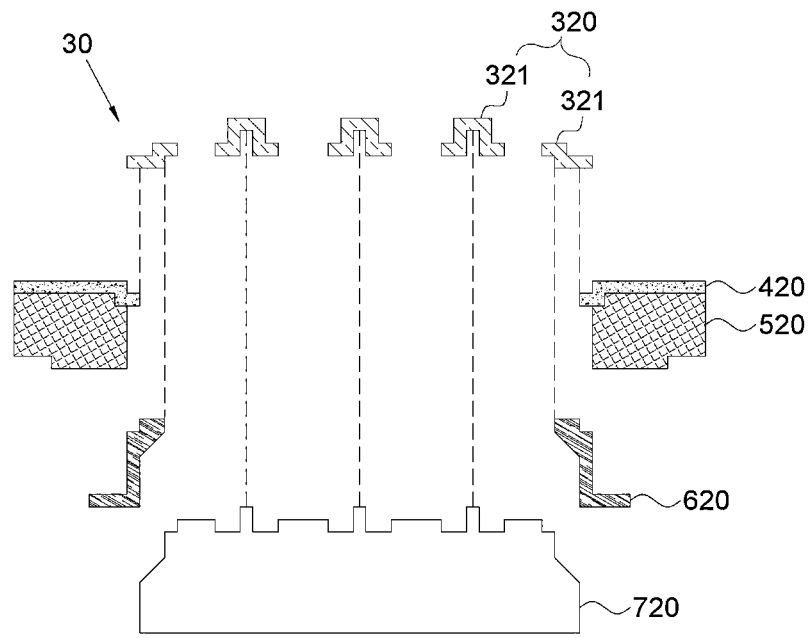
FIG. 6 is a cross-sectional view illustrating an N-direction emission unit according to the first embodiment of the present invention.

FIG. 6 is a cross-sectional view illustrating the N-direction connection unit 30 according to the first embodiment of the present invention. The N-direction connection unit 30 is a component which is provided on the lower surface of the N-layer N to connect an electrode to the N-layer N, protect a lower surface of the P-N junction 10, and convert an N-direction emission color. Specifically, the N-direction connection unit 30 includes an N-direction ohmic contact electrode 320, an N-connection electrode 620, and an N-direction encapsulant layer 720.

The N-direction ohmic contact electrode 320 is a component for forming an ohmic contact with the N-layer N. Specifically, the N-direction ohmic contact electrode 320 is deposited to as much as a predetermined thickness and formed on the lower surface of the N-layer N and a lower surface of the N-direction insulating part 220 and forms an ohmic contact with each N-direction island 120. Meanwhile, unlike the P-direction ohmic contact electrode 310, an opaque alloy material such as Ti/Al/Ni/Au or Cr/Ni/Au may be used for the N-direction ohmic contact electrode 320. Accordingly, the N-direction ohmic contact electrode 320 is provided as N-direction branch structures (NBSs) to partially expose the lower surface of the N-layer N. Here, the "branch structure" refers a structure including an edge portion and a branch portion extending inward from the edge portion.

Figure 7:
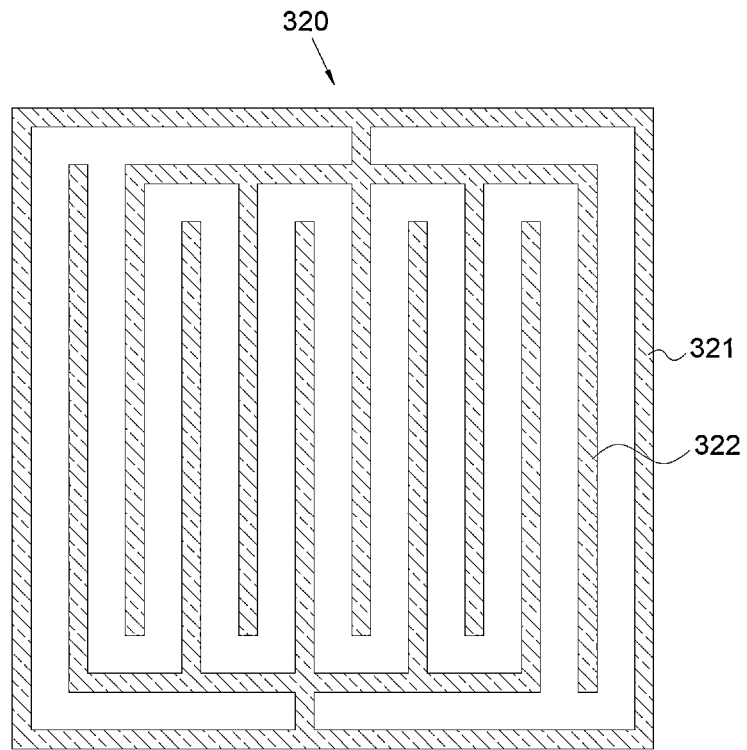
FIG. 7 is a plan view illustrating an N-direction ohmic contact electrode according to the first embodiment of the present invention.

FIG. 7 is a plan view illustrating the N-direction ohmic contact electrode 320 according to the first embodiment of the present invention. When the NBS is described in detail with reference to FIG. 7, an N-ohmic edge portion 321 in the form of a quadrilateral edge is formed at an edge of the lower surface of the N-layer N, and an N-ohmic branch portion 322, which extends inward from the N-ohmic edge portion 321 and is divided into a plurality of branches, is formed in each NMS. The N-ohmic edge portion 321 is a component which is connected to the N-connection electrode 620 to be described below, and the N-ohmic branch portion 322 is a component which extends from the N-ohmic edge portion 321 and is in contact with the NMS so as to widen the contact area with the N-layer N.

However, in FIGS. 2 to 6, although three NMSs and three N-ohmic branch portions 322 are illustrated as being provided for the sake of simplification of the drawings, and a relative width of each NMS with respect to the entire P-N junction 10 is illustrated as being wide, actually, larger numbers of the NMSs and the N-ohmic branch portions 322 may be provided as illustrated in FIG. 7, and each NMS may be provided to have a relatively small width with respect to the entire P-N junction 10.

The N-direction encapsulant layer 720 is a component which protects the lower surface of the P-N junction 10 and converts the N-direction emission color. Specifically, the N-direction encapsulant layer 720 is provided on a lower surface of the N-direction ohmic contact electrode 320 to convert a color of transmitted light. However, since the N-connection electrode 620 should be connected to the N-direction ohmic contact electrode 320, the N-direction encapsulant layer 720 is provided on the lower surface of the N-direction ohmic contact electrode 320 and is formed to expose an edge of the lower surface of the N-direction ohmic contact electrode 320. A material of the N-direction encapsulant layer 720 may be a mixture of a general phosphor and silicon, silicon, a PIG, or a remote phosphor.

The N-connection electrode 620 is a component which is connected to the N-direction ohmic contact electrode 320 to serve as a cathode. Specifically, the N-connection electrode is provided to surround a side surface of the N-direction encapsulant layer 720 and is connected to the edge of the lower surface of the N-direction ohmic contact electrode 320. In addition, the N-connection electrode 620 serves as a reflector to prevent light from escaping through the side surface of the N-direction encapsulant layer 720. One selected from among alloys and metals such as titanium Ti/Ag, Ti/Al, Ti/Au, Ag, Al, Cu, Ni, Ti/Al/Ni/Au, and Cr/Ni/Au may be used as a material of the N-connection electrode 620.

Meanwhile, since the N-direction ohmic contact electrode 320 and the N-direction encapsulant layer 720 are easily damaged due to the characteristics of the materials thereof, and the N-connection electrode 620 is thinly provided, there is a problem in that the N-connection electrode 620 does not serve to protect the N-direction encapsulant layer 720. In order to solve the problem, the N-direction connection unit 30 may include an N-direction support metal part 520. Specifically, the N-direction support metal part 520 is provided on outer surfaces of the N-direction ohmic contact electrode 320 and the N-connection electrode 620 to protect a structure of the N-direction connection unit 30. Any one selected from among metals such as Cu, CuW, Ni, and Au may be used for the N-direction support metal part 520.

In addition, an N-direction seed metal 420 may be provided to form the N-direction support metal part 520. Specifically, the N-direction seed metal 420 may be provided as a thin film to be applied on the outer surface of the N-direction ohmic contact electrode 320 and the lower surface of the N-direction insulating part 220 so that the N-direction support metal part 510 may be formed through an electrolytic plating process using the N-direction seed metal 420.

Figure 8:
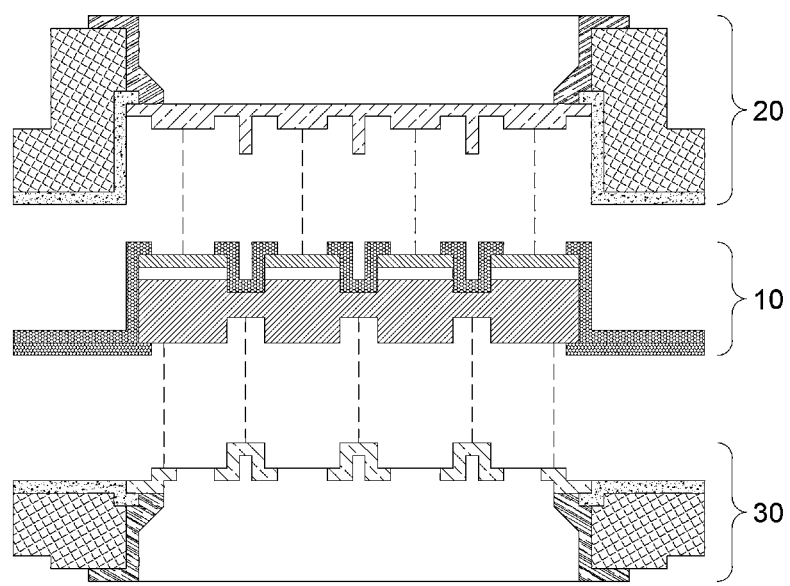
FIG. 8 is a cross-sectional view illustrating a coupling relationship between the P-N junction, the P-direction emission unit, and the N-direction emission unit according to the first embodiment of the present invention.

FIG. 8 is a cross-sectional view illustrating a coupling relationship between the P-N junction 10, the P-direction connection unit 20, and the N-direction connection unit 30 according to the first embodiment of the present invention. The P-direction connection unit 20 is provided on the upper surface of the P-layer P to connect an electrode to the P-layer P, protect the upper surface of the P-N junction 10, and convert the P-direction emission color. The N-direction connection unit 30 is provided on the lower surface of the N-layer N to connect an electrode to the N-layer N, protect the lower surface of the P-N junction 10, and convert the N-direction emission color. As a result, the LED chip including the single P-N junction 10 emits light through two surfaces due to the P-direction connection unit 20 and the N-direction connection unit 30.

Hereinafter, a method of manufacturing a dual emission LED chip according to a first embodiment of the present invention will be described in detail with reference to FIGS. 9 to 44.

Figure 9:
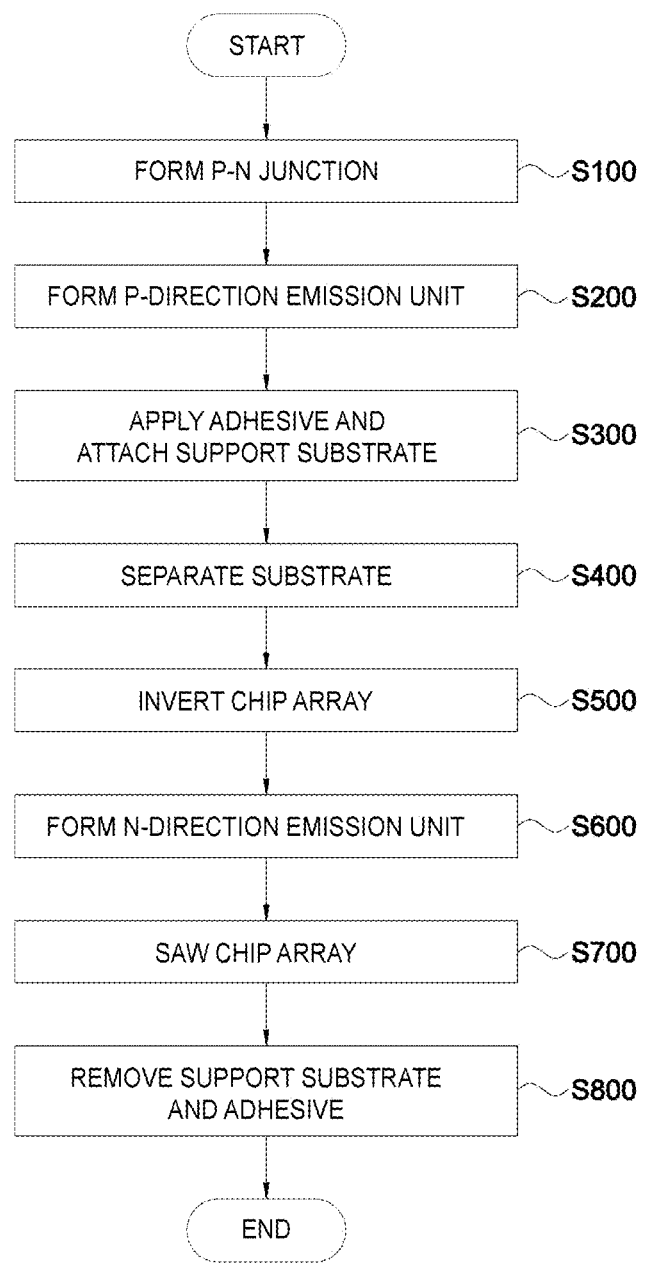
FIG. 9 is a flowchart illustrating a method of manufacturing a dual emission LED chip according to a first embodiment of the present invention.

FIG. 9 is a flowchart illustrating the method of manufacturing the dual emission LED chip according to the first embodiment of the present invention.

According to the present invention, the method of manufacturing the dual emission LED chip includes a first operation S100 of forming a P-N junction 10 on an upper surface of a substrate, a second operation S200 of forming a P-direction connection unit 20, a third operation S300 of applying an adhesive and attaching a support substrate, a fourth operation S400 of separating the substrate, a fifth operation S500 of inverting a chip array, a sixth operation S600 of forming an N-direction LED structure, a seventh operation S700 of removing the support substrate and the adhesive, and an eighth operation S800 of sawing the chip array to separate single chips.

Figure 10:
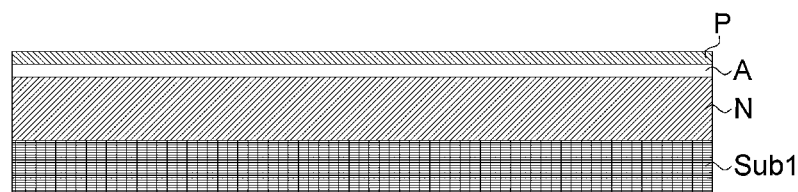
FIG. 10 is a cross-sectional view illustrating a first operation of forming a P-N junction according to the first embodiment of the present invention.

FIG. 10 is a cross-sectional view illustrating the first operation S100 of forming the P-N junction on an upper surface of a substrate Sub1 according to the first embodiment of the present invention.

The first operation S100 is an operation in which a semiconductor layer used for an LED is formed on the upper surface of the substrate Sub1, and an N-layer N, an active layer A, and a P-layer P are sequentially formed on the upper surface of the substrate Sub1. Each layer of the N-layer N, the active layer A, and the P-layer P may be formed through epitaxial growth (EPI growth) using an apparatus such as a metal-organic chemical vapor deposition (MOCVD) apparatus.

The substrate Sub1 is a substrate on which a semiconductor is grown on an upper surface thereof to form the LED and is formed as any one material substrate of single crystal substrates such as sapphire ($Al_2O_3$), Si, and SiC substrates. In the present description, description will be made based on that a sapphire substrate having a predetermined thickness is used.

Figure 11:
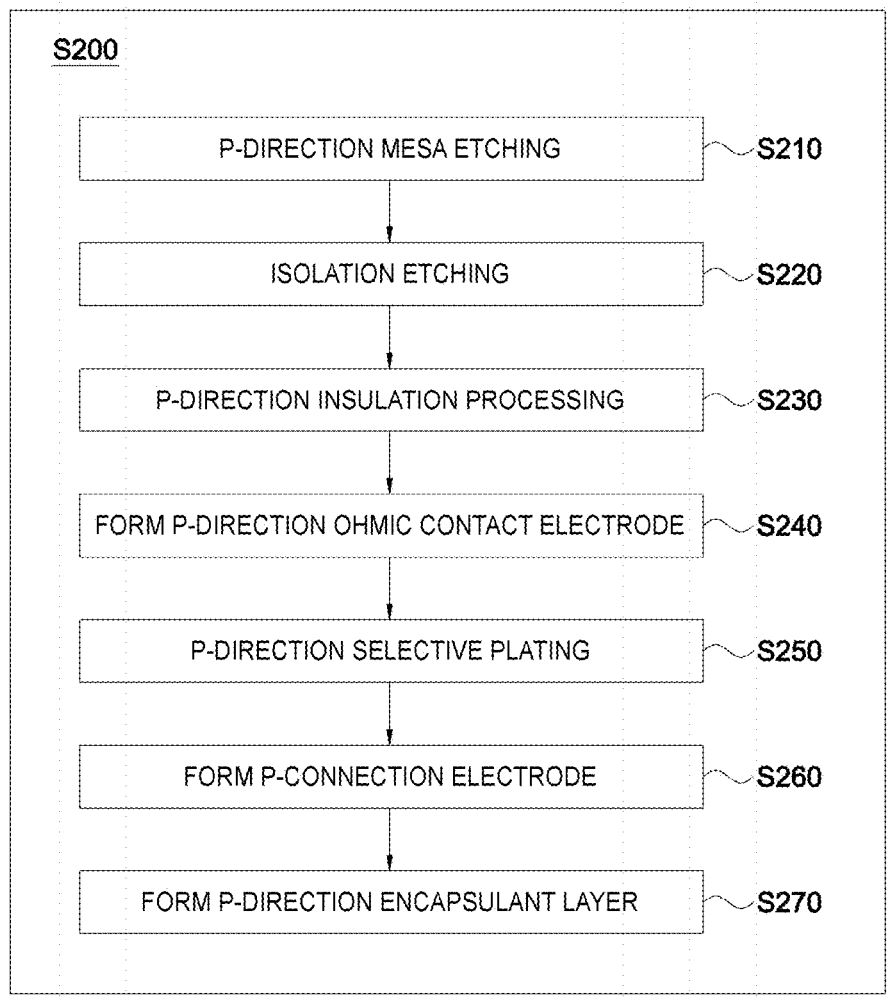
FIG. 11 is a flowchart illustrating a second operation of forming a P-direction emission unit according to the first embodiment of the present invention.

FIG. 11 is a flowchart illustrating the second operation S200 of forming the P-direction connection unit 20 according to the first embodiment of the present invention.

The second operation S200 is an operation of forming an electrode structure and an encapsulant structure on an upper surface of the P-layer. Specifically, the second operation S200 includes a P-direction mesa etching operation S210, an isolation etching operation S220, a P-direction insulation processing (passivation) operation S230, an operation S240 of forming a P-direction ohmic contact electrode 310, a P-direction selective plating operation S250, an operation S260 of forming a P-connection electrode 610, and an operation S270 of forming a P-direction encapsulant layer 710.

Figure 12:
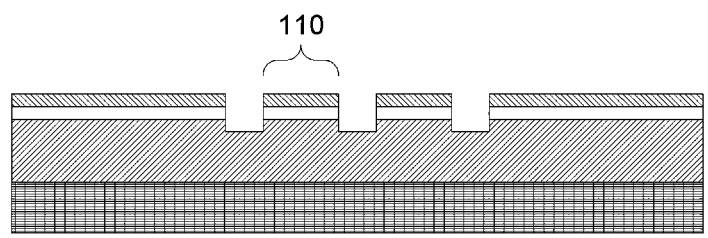
FIG. 12 is a cross-sectional view illustrating a P-direction mesa etching operation according to the first embodiment of the present invention.

FIG. 12 is a cross-sectional view illustrating the P-direction mesa etching operation S210 according to the first embodiment of the present invention.

The P-direction mesa etching operation S210 is an operation of forming a PMS and is an operation of etching and engraving the P-layer P from the upper surface of the P-layer P to a predetermined depth of the N-layer N. Specifically, a portion corresponding to a preset pattern is etched to as much as a predetermined first depth from the upper surface of the P-layer P through a dry etching method such as a reactive-ion etching (RIE) method or an inductively coupled plasma etching (ICP) method. The present embodiment has been described based on a mesa structure in which a plurality of P-direction islands 110 are formed.

Figure 13:
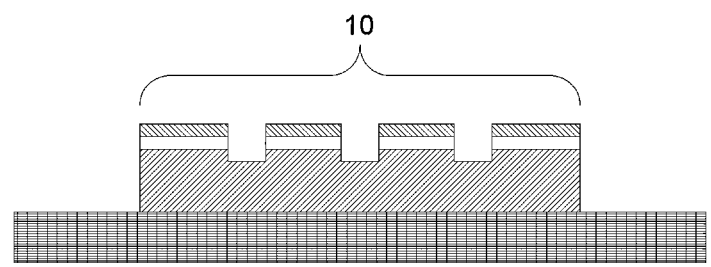
FIG. 13 is a cross-sectional view illustrating an isolation etching operation according to the first embodiment of the present invention.

FIG. 13 is a cross-sectional view illustrating the isolation etching operation S220 according to the first embodiment of the present invention.

The isolation etching operation S220 is an operation of etching and removing portions between individual chips in order to manufacture the plurality of chips by laterally and vertically dividing the P-layer P, the active layer A, and the N-layer N. The drawing in the present description illustrates a single chip in an array of the plurality of chips, and a portion outside the single chip is illustrated as being removed by being etched and isolated. Hereinafter, a portion of the substrate exposed through the isolation etching operation will be described as an isolation portion. In the isolation etching operation, a dry etching method such as an RIE method or an ICP method may be used.

Figure 14:
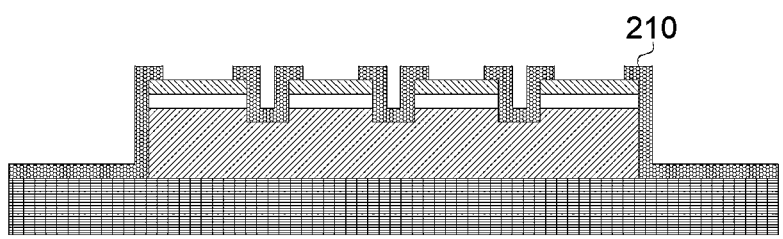
FIG. 14 is a cross-sectional view illustrating a P-direction insulation processing operation according to the first embodiment of the present invention.

FIG. 14 is a cross-sectional view illustrating the P-direction insulation processing operation S230 according to the first embodiment of the present invention.

The P-direction insulation processing operation S230 is an operation of forming a P-direction insulating part 210. Specifically, after an insulating film is deposited on entire surfaces of the substrate Sub1 and the chip to as much as a predetermined fourth thickness, a portion of the insulating film corresponding to each P-direction island 110 is removed to expose an upper surface of each P-direction island 110.

Figure 15:
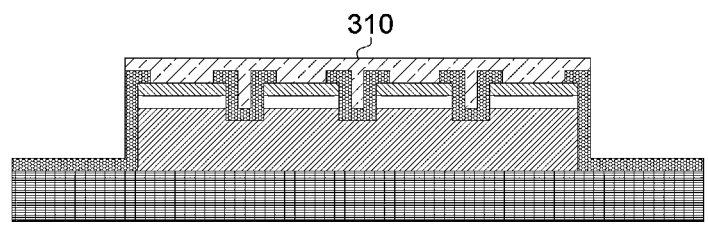
FIG. 15 is a cross-sectional view illustrating an operation of forming a P-direction ohmic contact electrode according to the first embodiment of the present invention.

FIG. 15 is a cross-sectional view illustrating the operation S240 of forming the P-direction ohmic contact electrode 310 according to the first embodiment of the present invention.

The operation S240 of forming the P-direction ohmic contact electrode 310 is an operation of forming the P-direction ohmic contact electrode 310 on an upper surface of the P-N junction 10. Specifically, the P-direction ohmic contact electrode 310 is deposited on the upper surface of the P-N junction 10 to as much as a predetermined fifth thickness, and the formed P-direction ohmic contact electrode 310 is in contact with the upper surface of each P-direction island 110.

Figure 16:
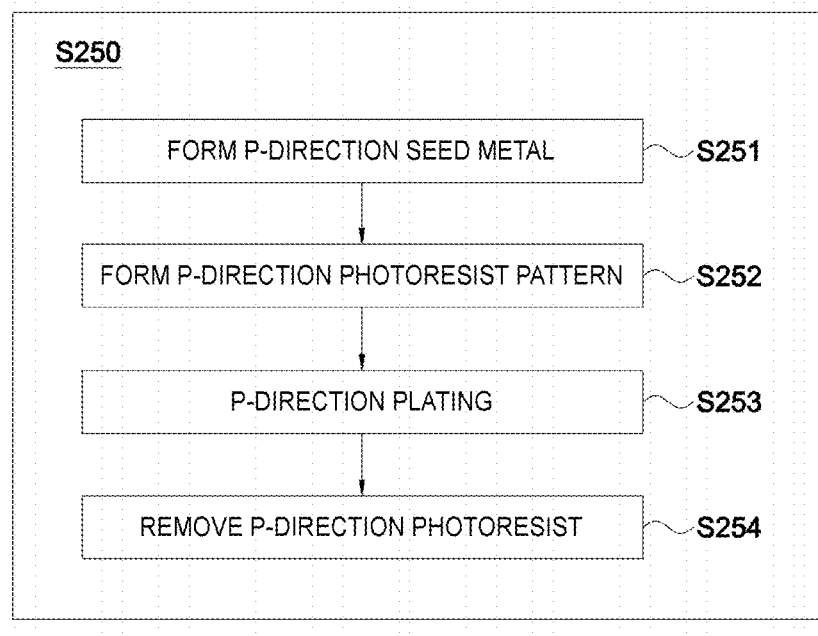
FIG. 16 is a flowchart illustrating a P-direction selective plating operation according to the first embodiment of the present invention.

FIG. 16 is a flowchart illustrating the P-direction selective plating operation S250 according to the first embodiment of the present invention.

The P-direction selective plating operation S250 is an operation of forming a P-direction support metal part 510. Specifically, the P-direction selective plating operation S250 includes an operation S251 of forming a P-direction seed metal 410, an operation S252 of forming a P-direction photoresist 511, a P-direction plating operation S253, and an operation S254 of removing the P-direction photoresist.

Figure 17:
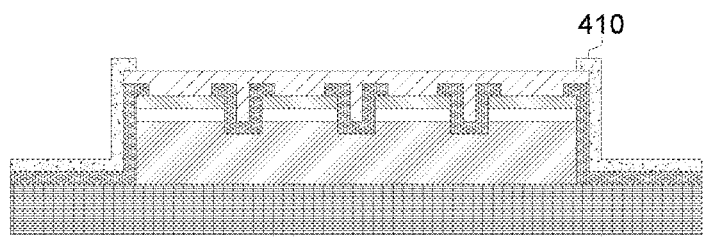
FIG. 17 is a cross-sectional view illustrating an operation of forming a P-direction seed metal according to the first embodiment of the present invention.

FIG. 17 is a cross-sectional view illustrating the operation S251 of forming the P-direction seed metal 410 according to the first embodiment of the present invention.

The operation S251 of forming the P-direction seed metal 410 is an operation of applying a seed metal necessary for an electrolytic plating process used in the P-direction plating operation S253 to be described below. Specifically, after the seed metal is applied on the substrate and the upper surface of the P-N junction 10, a portion corresponding to the upper surface of the P-N junction 10 is removed through etching and lift-off processes. Accordingly, an upper surface of the P-direction ohmic contact electrode 310 is exposed.

Figure 18:
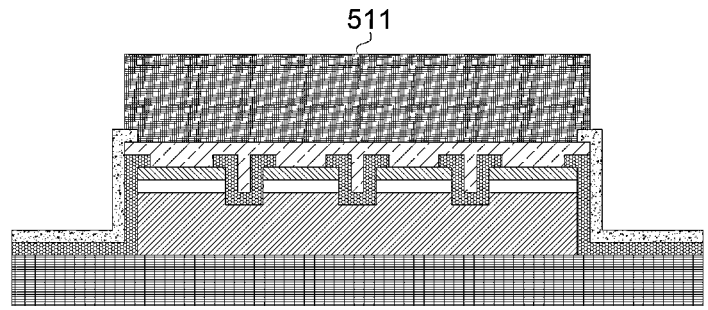
FIG. 18 is a cross-sectional view illustrating an operation of forming a P-direction photoresist according to the first embodiment of the present invention.

FIG. 18 is a cross-sectional view illustrating the operation S252 of forming the P-direction photoresist 511 according to the first embodiment of the present invention.

The operation S252 of forming the P-direction photoresist 511 is an operation of forming the P-direction photoresist 511 for selective plating through photolithography. Specifically, the photoresist 511 is formed on the upper surface of the P-N junction 10 such that the upper surface of the P-N junction 10 is not plated. Accordingly, only the P-direction seed metal 410 is exposed.

Figure 19:
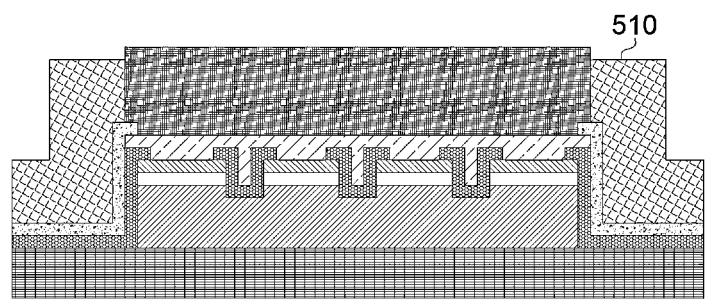
FIG. 19 is a cross-sectional view illustrating a P-direction plating operation according to the first embodiment of the present invention.

FIG. 19 is a cross-sectional view illustrating the P-direction plating operation S253 according to the first embodiment of the present invention.

The P-direction plating operation S253 is an operation of forming the P-direction support metal part 510 through electrolytic plating using the exposed P-direction seed metal 410. Specifically, the P-direction support metal part 510 is formed only on the P-direction seed metal 410 exposed due to the electrolytic plating process, and the P-N junction 10 is prevented from being damaged during the electrolytic plating process by the photoresist 511.

Figure 20:
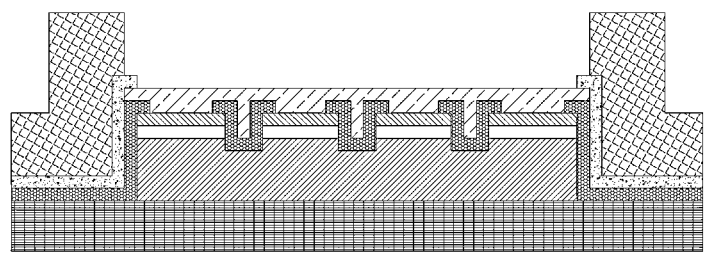
FIG. 20 is a cross-sectional view illustrating an operation of removing the P-direction photoresist according to the first embodiment of the present invention.

FIG. 20 is a cross-sectional view illustrating the operation S254 of removing the P-direction photoresist according to the first embodiment of the present invention.

The operation S254 of removing the P-direction photoresist 254 is an operation of removing the photoresist 511 used for selective plating. Accordingly, the upper surface of the P-direction ohmic contact electrode 310 is exposed again.

Figure 21:
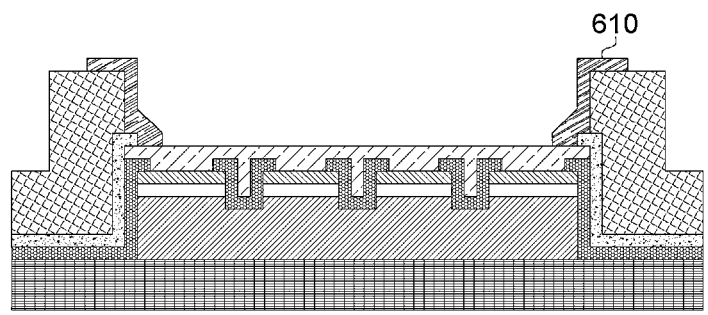
FIG. 21 is a cross-sectional view illustrating an operation of forming a P-connection electrode according to the first embodiment of the present invention.

FIG. 21 is a cross-sectional view illustrating the operation S260 of forming the P-connection electrode 610 according to the first embodiment of the present invention.

The operation S260 of forming the P-connection electrode 610 is an operation of forming the P-connection electrode 610 connected to the P-direction ohmic contact electrode 310. Specifically, the P-connection electrode 610 is formed in contact with an edge of the P-direction ohmic contact electrode 310 and formed in contact with an inner wall of the P-direction support metal part 510. In addition, in order to facilitate connection with a power source, the P-connection electrode 610 may be formed such that a predetermined width thereof is exposed on an upper surface of the P-direction support metal part 510.

Meanwhile, since the P-direction ohmic contact electrode 310 has high resistance, it may not be easy for electric charges to move between the P-direction ohmic contact electrode 310 and the P-connection electrode 610, and thus, the P-connection electrode 610 may have a PBS for increasing a contact area with the P-direction ohmic contact electrode 310. Here, a "branch structure" refers a structure including an edge portion and a branch portion extending inward from the edge portion like the above-described NBS.

Figure 22:
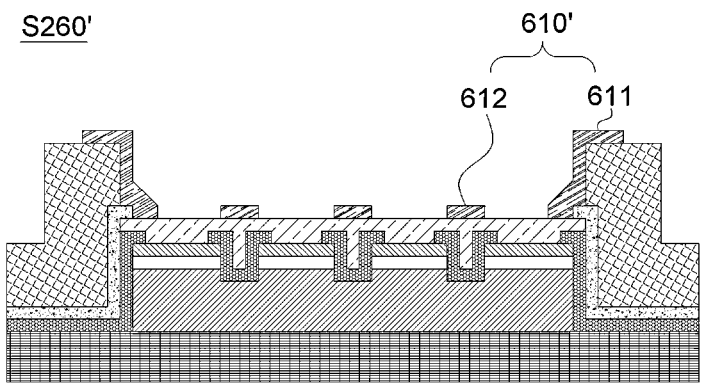
FIG. 22 is a cross-sectional view illustrating an operation of forming a P-connection electrode provided as a branch structure according to another embodiment of the present invention.
Figure 23:
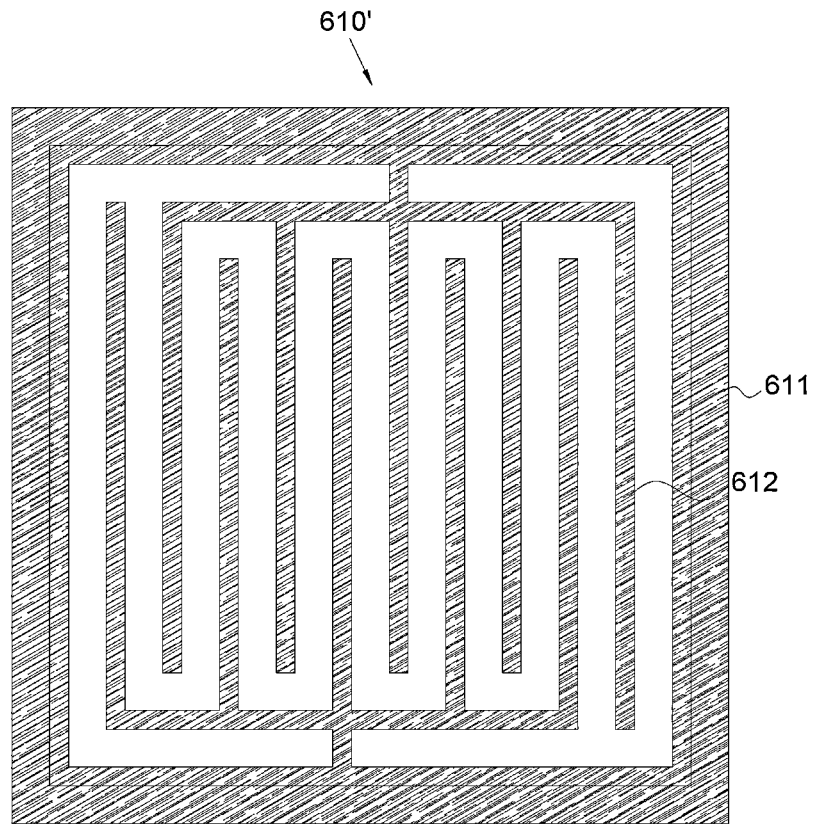
FIG. 23 is a plan view illustrating the P-connection electrode provided as the branch structure according to another embodiment of the present invention.

FIG. 22 is a cross-sectional view illustrating an operation S260' of forming a P-connection electrode 610' provided as a branch structure according to another embodiment of the present invention, and FIG. 23 is a plan view illustrating the P-connection electrode 610' provided as the branch structure according to another embodiment of the present invention. However, in FIG. 22, although three P-electrode branch portions 612 are illustrated as being provided for the sake of simplification of the drawing, and a relative width of each P-electrode branch portion 612 with respect to the entire P-N junction 10 is illustrated as being wide, actually, as illustrated in FIG. 23, a larger number of the P-electrode branch portions 612 may be provided, and each P-electrode branch portion 612 may be provided to have a relatively small width with respect to the entire P-N junction 10.

When the PBS is described in detail with reference to FIGS. 22 and 23, the P-electrode edge portion 611 is formed in contact with an edge of the upper surface of the P-direction ohmic contact electrode and formed in contact with an inner wall and an upper surface of the P-direction plating metal. In addition, the plurality of P-electrode branch portions 612, which extend inward from the P-electrode edge portion 611 and are divided into a plurality of branches, are formed on the upper surface of the P-direction ohmic contact electrode 310. Since each of the P-electrode edge portion 611 and the P-electrode branch portion 612 is formed in contact with the P-direction ohmic contact electrode 310, it is easy for electric charges to move. In addition, when the PBS and the NBS are provided to be symmetrical, there is an effect of increasing a spreading effect.

Figure 24:
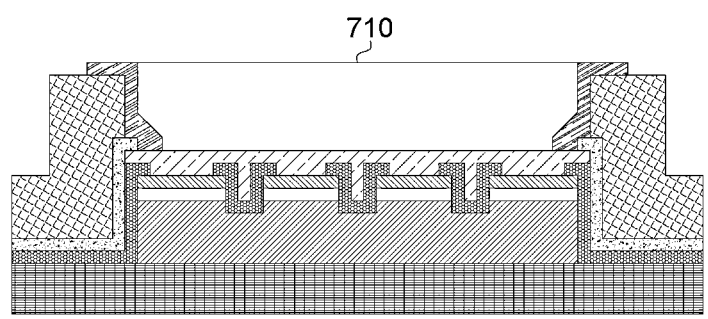
FIG. 24 is a cross-sectional view illustrating an operation of forming a P-direction encapsulant layer according to the first embodiment of the present invention.

FIG. 24 is a cross-sectional view illustrating the operation S270 of forming the P-direction encapsulant layer 710 according to the first embodiment of the present invention.

The operation S270 of forming the P-direction encapsulant layer 710 is an operation of forming the P-direction encapsulant layer 710 on the upper surface of the P-direction ohmic contact electrode 310. Specifically, an encapsulant is applied to a space surrounded by the P-direction ohmic contact electrode 310 and the P-connection electrode 610 to form the P-direction encapsulant layer 710.

Figure 25:
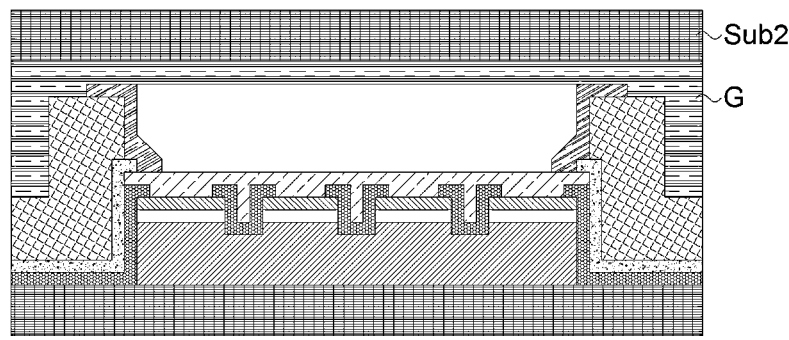
FIG. 25 is a cross-sectional view illustrating a third operation of applying an adhesive and attaching a support substrate according to the first embodiment of the present invention.

FIG. 25 is a cross-sectional view illustrating the third operation S300 of applying an adhesive G and attaching a support substrate Sub2 according to the first embodiment of the present invention.

The third operation S300 of applying the adhesive G and attaching the support substrate Sub2 is an operation of attaching the support substrate Sub2 to the upper surface of the P-direction connection unit for operations to be described below. Any one selected from among glass, Si, metals, and ceramics may be used for the support substrate Sub2.

Figure 26:
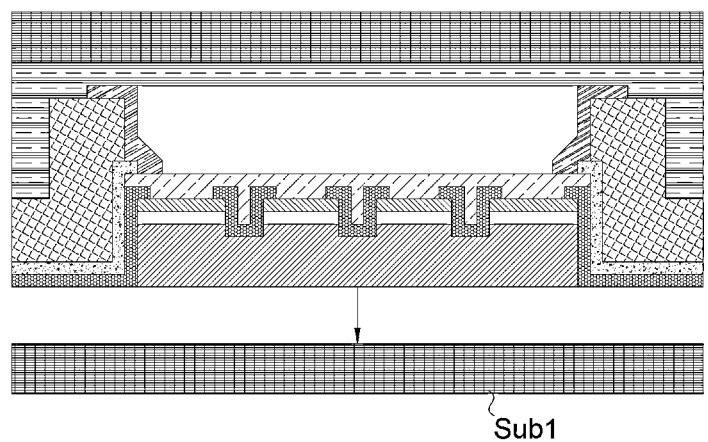
FIG. 26 is a cross-sectional view illustrating a fourth operation of separating a substrate according to the first embodiment of the present invention.

FIG. 26 is a cross-sectional view illustrating the fourth operation S400 of separating the substrate Sub1 according to the first embodiment of the present invention.

The fourth operation S400 of removing the substrate is an operation of separating and removing the substrate Sub1 to form an N-direction connection unit 30 on a lower surface of the N-layer N. The substrate Sub1 may be separated through laser lift-off and chemical lift-off methods.

Figure 27:
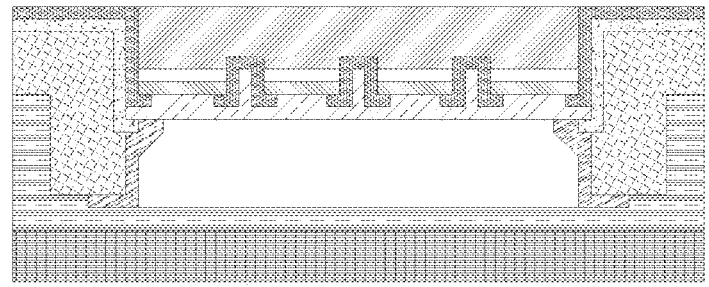
FIG. 27 is a cross-sectional view illustrating a fifth operation of inverting a chip array according to the first embodiment of the present invention.

FIG. 27 is a cross-sectional view illustrating the fifth operation S500 of inverting the chip array according to the first embodiment of the present invention.

The fifth operation S500 of inverting the chip array is an operation of inverting the chip array in order to facilitate the formation of the N-direction connection unit 30. Hereinafter, a direction of the inverted N-layer N is defined as an upper side, and a direction of the P-layer P is defined as a lower side.

Figure 28:
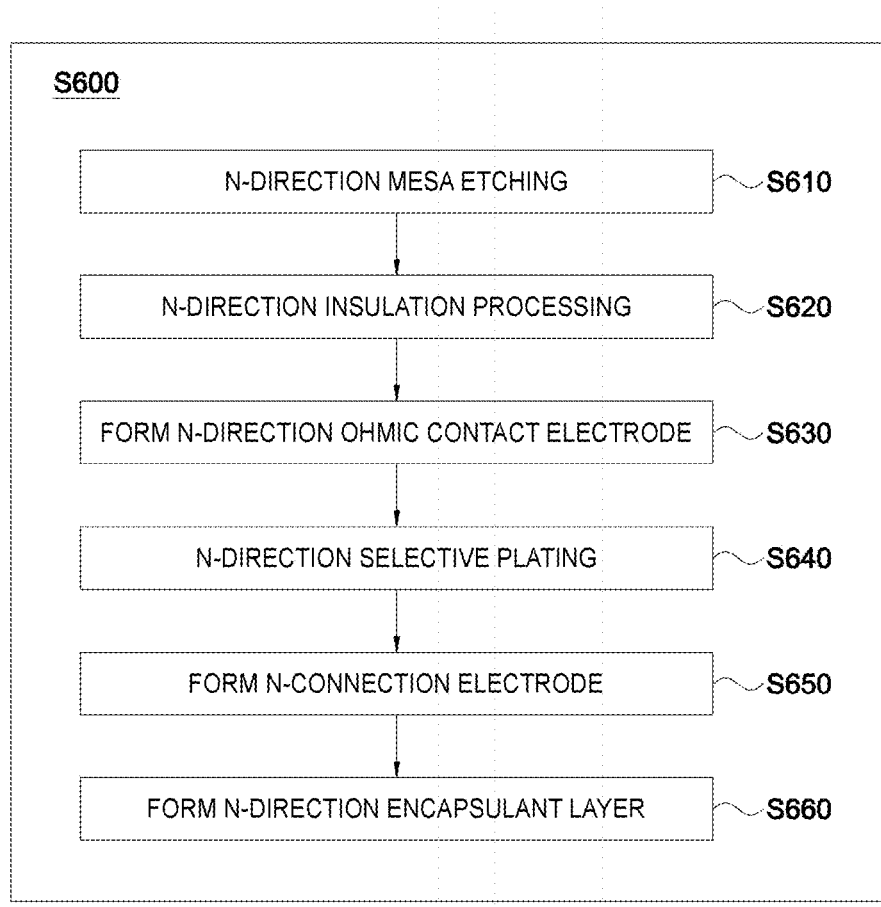
FIG. 28 is a flowchart illustrating a sixth operation of forming an N-direction emission unit according to the first embodiment of the present invention.

FIG. 28 is a flowchart illustrating the sixth operation S600 of forming the N-direction connection unit 30 according to the first embodiment of the present invention.

The sixth operation S600 is an operation of forming an electrode structure and an encapsulant structure on an upper surface of the N-layer. Specifically, the sixth operation S600 includes an N-direction mesa etching operation S610, an N-direction insulation (passivation) processing operation S620, an operation S640 of forming an N-direction ohmic contact electrode 320, an N-direction selective plating operation S640, an operation S660 of forming an N-connection electrode 620, and an operation S660 of forming an N-direction encapsulant layer 720.

Figure 29:
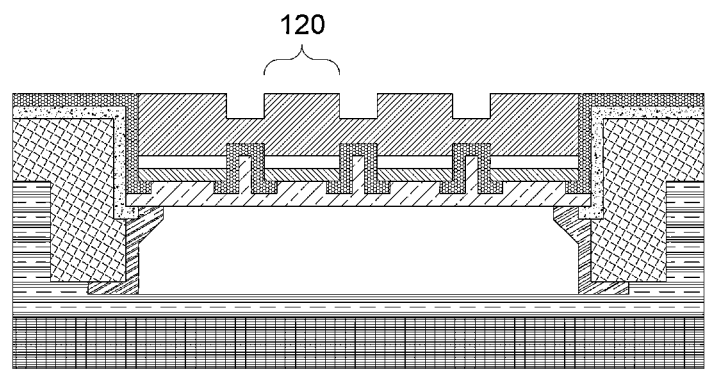
FIG. 29 is a cross-sectional view illustrating an N-direction mesa etching operation according to the first embodiment of the present invention.

FIG. 29 is a cross-sectional view illustrating the N-direction mesa etching operation S610 according to the first embodiment of the present invention.

The N-direction mesa etching operation S610 is an operation of forming an NMS and is an operation of etching and engraving the N-layer N from the upper surface of the N-layer N to as much as a predetermined depth. Specifically, a portion corresponding to a preset pattern is etched to as much as a predetermined second depth from the upper surface of the N-layer through a dry etching method such as an RIE method or an ICP method. The present embodiment has been described based on a mesa structure in which a plurality of N-direction islands 120 are formed.

Figure 30:
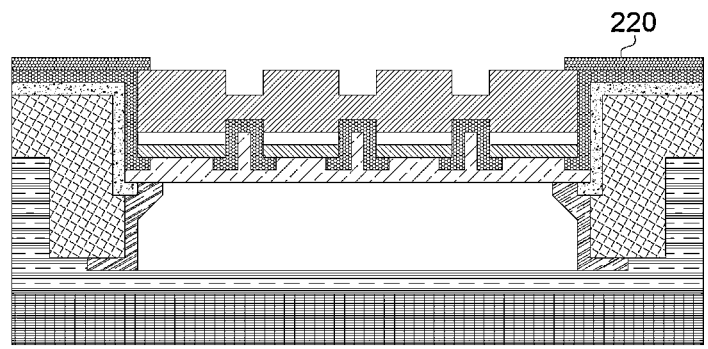
FIG. 30 is a cross-sectional view illustrating an N-direction insulation processing operation according to the first embodiment of the present invention.

FIG. 30 is a cross-sectional view illustrating the N-direction insulation processing operation S620 according to the first embodiment of the present invention.

The N-direction insulation processing operation S620 is an operation of forming an N-direction insulating part 220. Specifically, after an insulating film is deposited on the entire surfaces of the substrate Sub1 and the chip to as much as a predetermined fourth thickness, a portion of the insulating film corresponding to the upper surface of the N-layer N is removed to expose the upper surface of the N-layer N. Unlike the case of the P-direction insulating part 210, an insulating film is not formed on the NMS.

Figure 31:
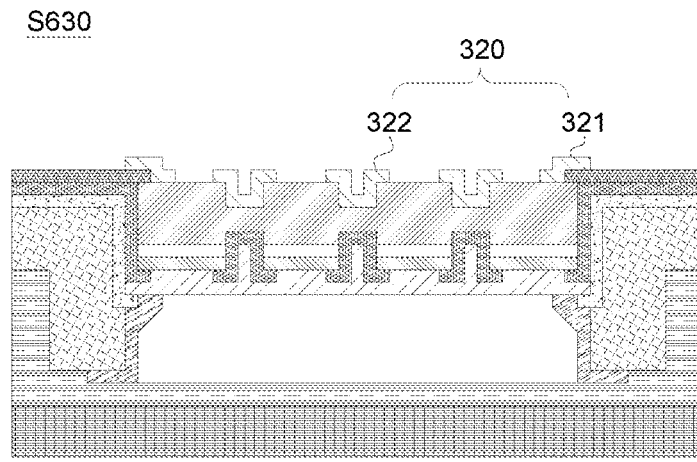
FIG. 31 is a cross-sectional view illustrating an operation of forming an N-direction ohmic contact electrode according to the first embodiment of the present invention.

FIG. 31 is a cross-sectional view illustrating the operation S630 of forming the N-direction ohmic contact electrode 320 according to the first embodiment of the present invention.

The operation S630 of forming the N-direction ohmic contact electrode 320 is an operation of forming the N-direction ohmic contact electrode 320 on the upper surface of the P-N junction 10. Specifically, the N-direction ohmic contact electrode 320 is deposited on the upper surface of the P-N junction 10 to as much as a predetermined fifth thickness and is formed in the above-described NBS, and thus, each N-ohmic branch portion 322 is provided in contact with the NMS.

Figure 32:
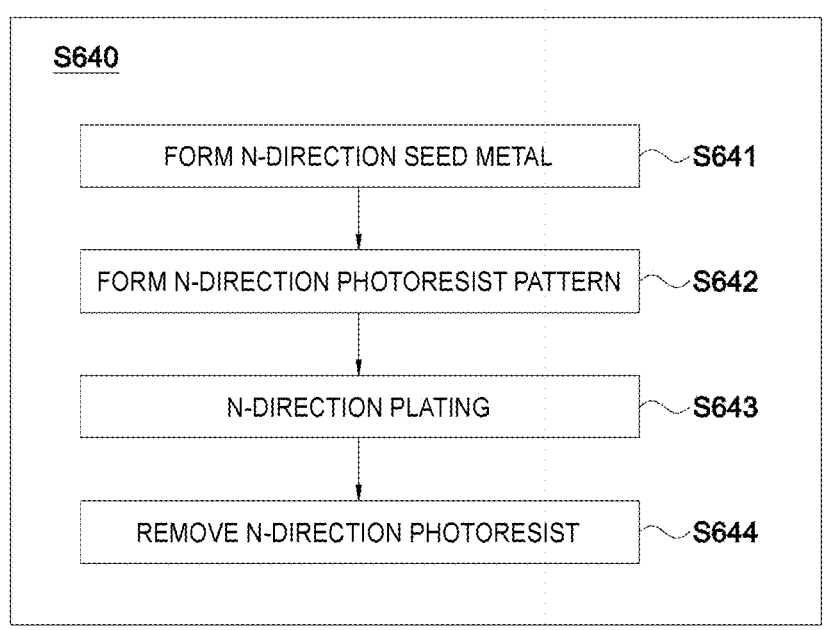
FIG. 32 is a flowchart illustrating an N-direction selective plating operation according to the first embodiment of the present invention.

FIG. 32 is a flowchart illustrating the N-direction selective plating operation S640 according to the first embodiment of the present invention.

The N-direction selective plating operation S640 is an operation of forming an N-direction support metal part 520. Specifically, the N-direction selective plating operation S640 includes an operation S641 of forming an N-direction seed metal 420, an operation S642 of forming an N-direction photoresist 521, N-direction plating operation S643, and an operation S644 of removing the N-direction photoresist.

Figure 33:
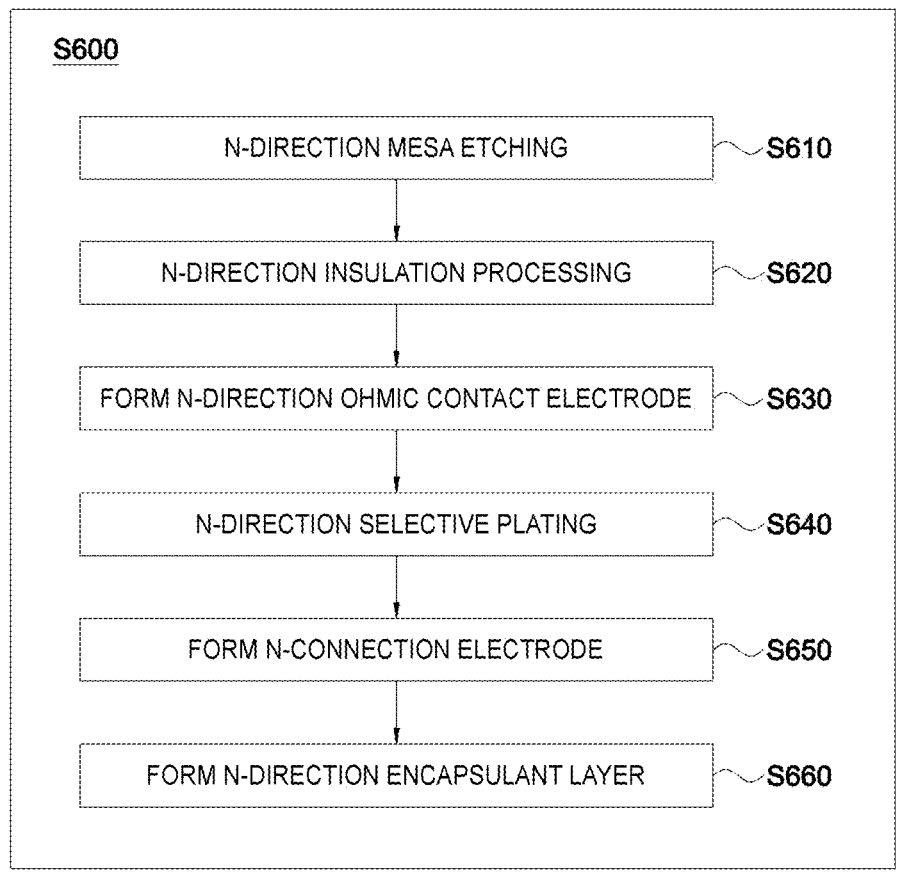
FIG. 33 is a cross-sectional view illustrating an operation of forming an N-direction seed metal according to the first embodiment of the present invention.

FIG. 33 is a cross-sectional view illustrating the operation S641 of forming the N-direction seed metal 420 according to the first embodiment of the present invention.

The operation S641 of forming the N-direction seed metal 420 is an operation of applying a seed metal necessary for an electrolytic plating process used in the N-direction plating operation S643 to be described below. Specifically, after the seed metal is applied on the substrate and the upper surface of the P-N junction 10, a portion corresponding to the upper surface of the P-N junction 10 is removed through etching and lift-off processes. Accordingly, upper surfaces of the N-direction ohmic contact electrode 320 and each N-direction island 120 are exposed.

Figure 34:
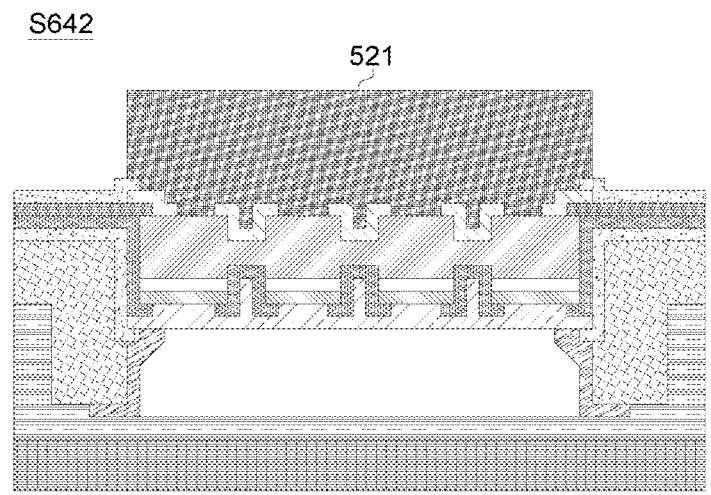
FIG. 34 is a cross-sectional view illustrating an operation of forming an N-direction photoresist according to the first embodiment of the present invention.

FIG. 34 is a cross-sectional view illustrating the operation S642 of forming the N-direction photoresist 521 according to the first embodiment of the present invention.

The operation S642 of forming the N-direction photoresist 521 is an operation of forming the N-direction photoresist 521 for selective plating through photolithography. Specifically, the photoresist 521 is formed on the upper surface of the P-N junction 10 such that the upper surface of the P-N junction 10 is not plated. Accordingly, only the N-direction seed metal 420 is exposed.

Figure 35:
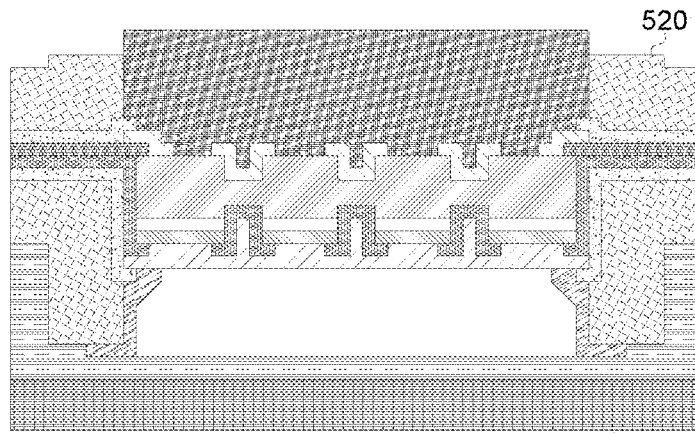
FIG. 35 is a cross-sectional view illustrating an N-direction plating operation according to the first embodiment of the present invention.

FIG. 35 is a cross-sectional view illustrating the N-direction plating operation S643 according to the first embodiment of the present invention.

The N-direction plating operation S643 is an operation of forming the N-direction support metal part 520 through electrolytic plating using the exposed N-direction seed metal 420. Specifically, the P-direction support metal part 520 is formed only on the P-direction seed metal 420 exposed due to the electrolytic plating process, and the P-N junction 10 is prevented from being damaged during the electrolytic plating process by the photoresist 521.

Figure 36:
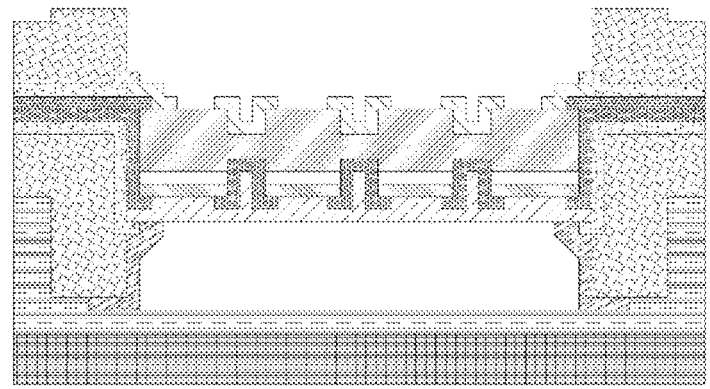
FIG. 36 is a cross-sectional view illustrating an operation of removing the N-direction photoresist according to the first embodiment of the present invention.

FIG. 36 is a cross-sectional view illustrating the operation S644 of removing the N-direction photoresist according to the first embodiment of the present invention.

The operation S644 of removing the N-direction photoresist is an operation of removing the photoresist 521 used for selective plating. Accordingly, the upper surface of the N-direction ohmic contact electrode 320 and the upper surface of each N-direction island 120 are exposed again.

Figure 37:
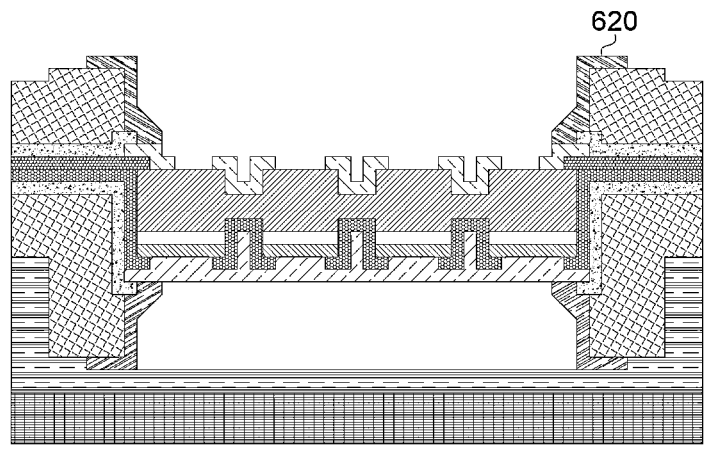
FIG. 37 is a cross-sectional view illustrating an operation of forming an N-connected electrode according to the first embodiment of the present invention.

FIG. 37 is a cross-sectional view illustrating the operation S650 of forming the N-connection electrode 620 according to the first embodiment of the present invention.

The operation S650 of forming the N-connection electrode 620 is an operation of forming the N-connection electrode 620 connected to the N-direction ohmic contact electrode 320. Specifically, the N-connection electrode 620 is formed in contact with an upper surface of the N-ohmic edge portion 321 and formed in contact with an inner wall of the N-direction support metal part 520. In addition, in order to facilitate connection with the power source, the N-connection electrode 620 may be formed such that a predetermined width thereof is exposed on an upper surface of the N-direction support metal part 520.

Figure 38:
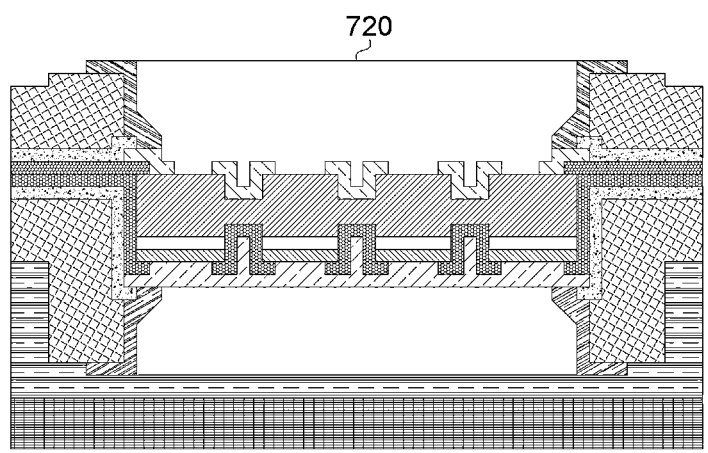
FIG. 38 is a cross-sectional view illustrating an operation of forming an N-direction encapsulant layer according to the first embodiment of the present invention.

FIG. 38 is a cross-sectional view illustrating the operation S660 of forming the N-direction encapsulant layer 720 according to the first embodiment of the present invention.

The operation S660 of forming the N-direction encapsulant layer 720 is an operation of forming the N-direction encapsulant layer 720 on the upper surface of the N-direction ohmic contact electrode 320 and the upper surface of the N-layer N. Specifically, an encapsulant is applied to a space surrounded by the N-direction ohmic contact electrode 320, the N-layer N, and the N-connection electrode 620 to form the N-direction encapsulant layer 720.

The seventh operation S700 of removing the support substrate Sub2 and the adhesive G is an operation of removing the support substrate Sub2 and the adhesive G attached to an lower surface of the P-direction connection unit 20 and exposing the P-direction connection unit 20 again so as to form the N-direction connection unit 30.

The operation S800 of sawing the chip array to separate single chips is an operation of sawing and separating each of the plurality of chips forming the array. Each single chip may be sawn through a laser scribe process or a dicing process.

Figure 39:
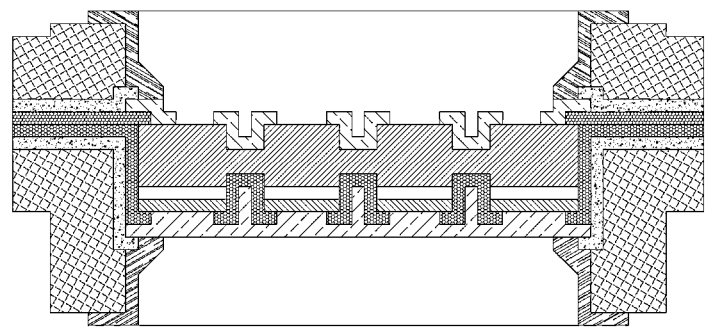
FIG. 39 is a cross-sectional view illustrating the dual emission LED chip after the adhesive and the support substrate are removed according to the first embodiment of the present invention.

FIG. 39 is a cross-sectional view illustrating a dual emission LED chip after the adhesive and the support substrate are removed according to the first embodiment of the present invention. After the seventh operation S700 and the eighth operation S800 are performed, the single dual emission LED chip is completed.

Meanwhile, as a second embodiment of the present invention, a dual emission LED chip having a flat structure without a PMS and/or an NMS may be provided. Specifically, as the second embodiment of the present invention, an N-layer N, an active layer A, and a P-layer P may be provided in a flat structure without a mesa structure, and a dual emission LED chip, in which each P-direction island 110 and each N-direction island 120 are not formed, may be provided.

Hereinafter, the second embodiment of the present invention will be described in detail with reference to FIGS. 40 to 44.

Figure 40:
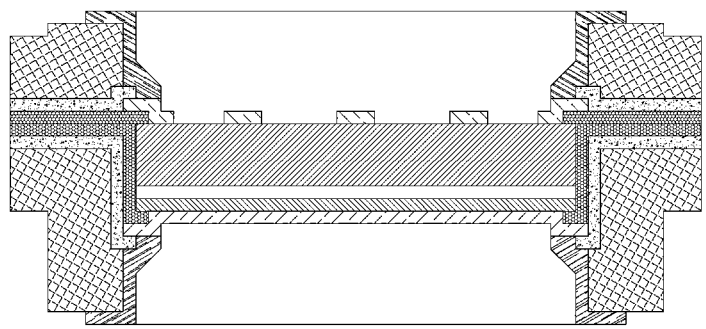
FIG. 40 is a cross-sectional view illustrating a dual emission LED chip according to a second embodiment of the present invention.

FIG. 40 is a cross-sectional view illustrating the dual emission LED chip according to the second embodiment of the present invention. Unlike the dual emission LED chip according to the first embodiment shown in FIG. 39, there is provided a modified P-direction insulating part 210' from which the insulating film formed on the PMS in the P-direction insulation processing operation S230 according to the first embodiment is excluded. In addition, the N-ohmic branch portion 322 formed in the NMS in the operation S630 of forming the N-direction ohmic contact electrode 320 according to the first embodiment is formed as a modified N-direction branch structure' (NBS') in contact with an upper surface of the N-layer instead of being formed in the NMS.

Figure 41:
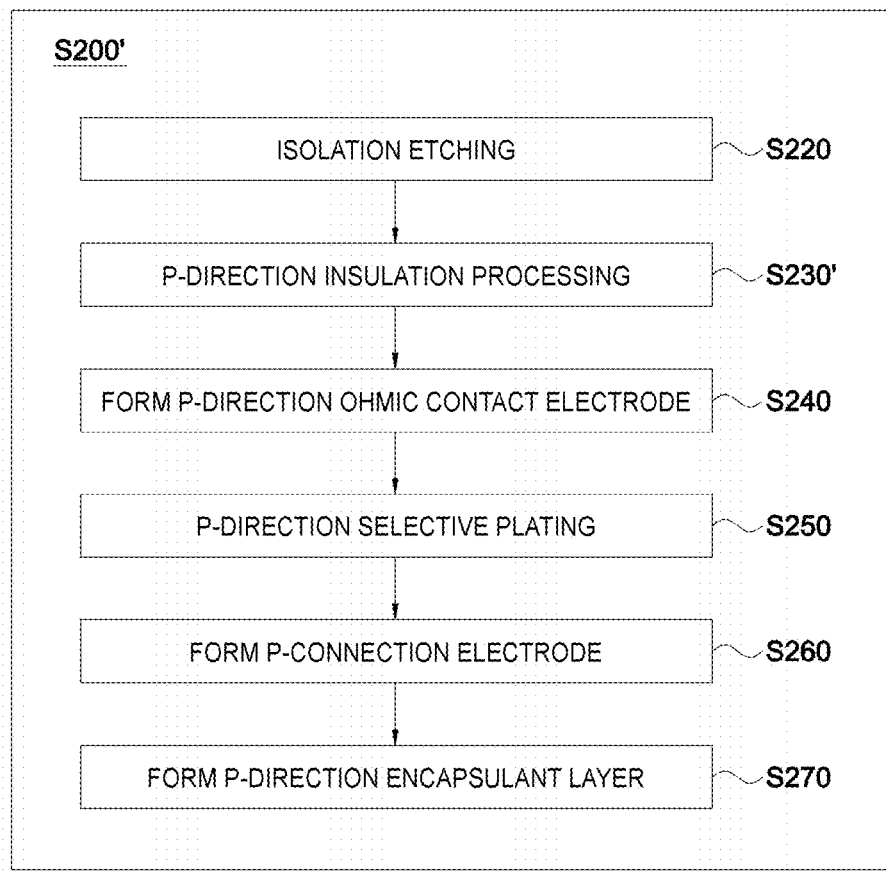
FIG. 41 is a flowchart illustrating a second-1 operation of forming a P-direction emission unit according to the second embodiment of the present invention.

FIG. 41 is a flowchart illustrating a second-1 operation S200' of forming a P-direction emission unit 20' according to the second embodiment of the present invention. The second-1 operation S200' is an operation replacing the second operation S200 of the first embodiment. In the operation S200, the P-direction mesa etching operation S210 is excluded, and the P-direction insulation processing operation S230 is replaced with a modified P-direction insulation processing operation S230'. For the remainder, as in the first embodiment, the operation S200' of forming the P-direction emission unit 20' includes the isolation etching operation S220, the operation S240 of forming the P-direction ohmic contact electrode 310, the P-direction selective plating operation S250, the operation 260 of forming the P-connection electrode 610, and the operation S270 of forming the P-direction encapsulant layer 710.

Figure 42:
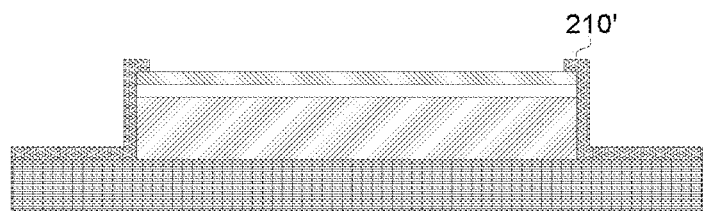
FIG. 42 is a cross-sectional view illustrating a second P-direction insulation processing operation according to the second embodiment of the present invention.

FIG. 42 is a cross-sectional view illustrating the second P-direction insulation processing operation S230' according to the first embodiment of the present invention. The second P-direction insulation processing operation S230' is characterized in that the insulating film formed on the PMS in the P-direction insulation processing operation S230 of the first embodiment is excluded. According to the second embodiment of the present invention, since a mesa structure is not formed, only a chip isolation portion is insulated. Specifically, after an insulating film is deposited on entire surfaces of a substrate Sub1 and a chip to as much as a predetermined fourth thickness, a portion of the insulating film corresponding to an upper surface of the P-layer P is removed.

Figure 43:
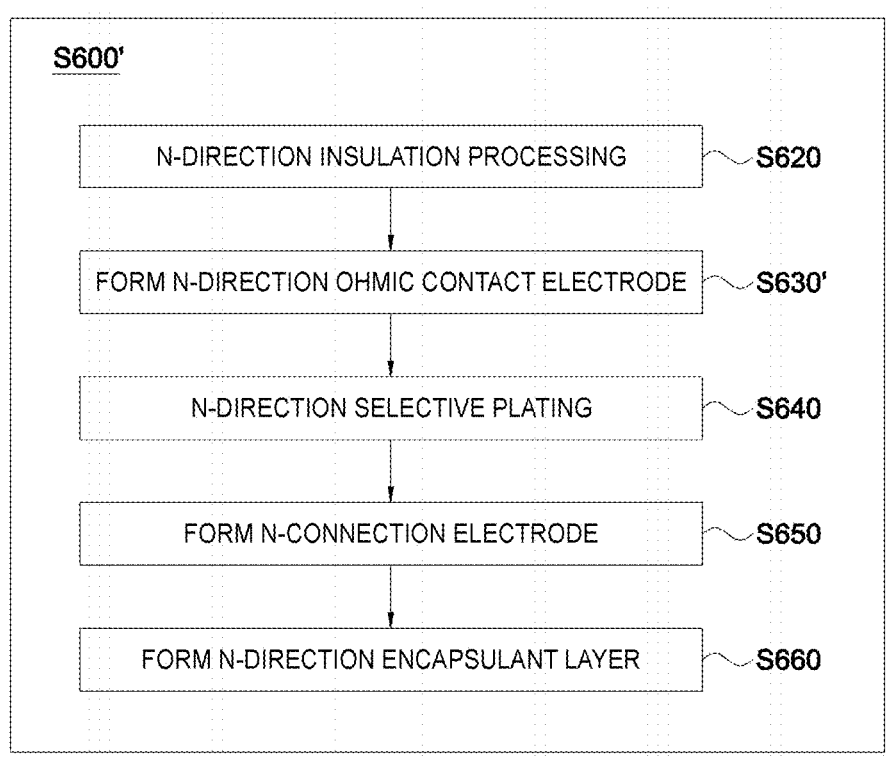
FIG. 43 is a flowchart illustrating a sixth-1 operation of forming an N-direction emission unit according to the second embodiment of the present invention.

FIG. 43 is a flowchart illustrating a sixth-1 operation S600' of forming an N-direction connection unit 30 according to the second embodiment of the present invention. The sixth-1 operation S600' is an operation replacing the sixth operation S600 of the first embodiment. In the sixth-1 operation S600', the N-direction mesa etching operation S610 is excluded, and the operation S630 of forming the N-direction ohmic contact electrode 320 is replaced with an operation 630' of forming a modified N-direction ohmic contact electrode 320'. For the remainder, as in the first embodiment, the sixth-1 operation S600' of forming the N-direction connection unit 30 includes the N-direction insulation processing operation S620, the N-direction selective plating operation S640, the operation S650 of forming the N-connection electrode 620, and the operation S660 of forming the N-direction encapsulant layer 720.

Figure 44:
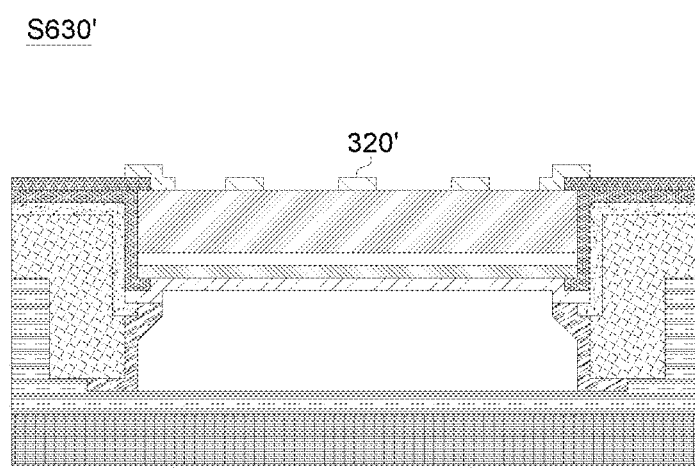
FIG. 44 is a cross-sectional view illustrating an operation of forming a second N-direction ohmic contact electrode according to the second embodiment of the present invention.

FIG. 44 is a cross-sectional view illustrating the operation S630' of forming the modified N-direction ohmic contact electrode 320' according to the second embodiment of the present invention. The operation S630' of forming the modified N-direction ohmic contact electrode 320' is characterized in that the N-direction ohmic contact electrode 320 in the operation S630 of forming the N-direction ohmic contact electrode 320 of the first embodiment is formed in a modified NBS' in contact with the upper surface of the N-layer instead of being formed in the NMS.

INDUSTRIAL APPLICABILITY

According to the present invention, since a dual emission light-emitting diode (LED) chip is applicable as a single chip to a field requiring double-sided emission, an application apparatus can be miniaturized, power efficiency can be increased, and manufacturing costs can be reduced.

In addition, since the dual emission LED chip manufactured according to the present invention can be manufactured through a batch process, a separate packaging process is not required.

Furthermore, in the dual emission LED chip according to the present invention, the total internal reflection of light generated by an LED is reduced to increase luminous efficiency.

The invention claimed is:

1. A dual emission light-emitting diode (LED) chip comprising an LED chip which uses an electroluminescence effect of a P-N junction including a P-layer (P) and an N-layer (N) below the P-layer (P),
   wherein light is emitted in each of an upward direction of the P-layer (P) and a downward direction of the N-layer (N),
   wherein a P-direction connection unit is provided on an upper surface of the P-layer (P),
   wherein an N-direction connection unit is provided on a lower surface of the N-layer (N),
   wherein the P-direction connection unit provides a power connection to the P-layer (P),
   wherein the N-direction connection unit provides a power connection to the N-layer (N), and
   wherein the P-N junction is protected from an external environment by the P-direction connection unit and the N-direction connection unit.

2. The dual emission LED chip of claim 1, wherein the P-layer (P) includes one or more P-direction mesa structures (PMSs) formed by engraving the P-layer (P) from the upper surface of the P-layer (P) to a predetermined depth of the N-layer (N), and the N-layer (N) includes one or more N-direction mesa structures (NMSs) formed by engraving the N-layer (N) from the lower surface of the N-layer (N) to a predetermined depth thereof.

3. The dual emission LED chip of claim 1, wherein the P-direction connection unit includes a P-connection electrode provided on the upper surface of the P-layer (P), the P-layer (P) is connected to a power source from the upward direction thereof through the P-connection electrode, the N-direction connection unit includes an N-connection electrode provided on the lower surface of the N-layer (N), and the N-layer (N) is connected to the power source from the downward direction thereof through the N-connection electrode.

4. The dual emission LED chip of claim 3, wherein the P-direction connection unit includes a P-direction ohmic contact electrode provided between the P-layer (P) and the P-connection electrode to form an ohmic contact between the P-layer (P) and the P-connection electrode, and
   the N-direction connection unit includes an N-direction ohmic contact electrode provided between the N-layer (N) and the N-connection electrode to form an ohmic contact between the N-layer (N) and the N-connection electrode.

5. The dual emission LED chip of claim 4, wherein the N-direction ohmic contact electrode is provided with a branch structure (BS).

6. The dual emission LED chip of claim 3, wherein the P-connection electrode is provided in a form of a wall having a predetermined height in an upward direction from the upper surface of the P-layer (P) along an edge thereof, and the N-connection electrode is provided in a form of a wall having a predetermined height in a downward direction from the lower surface of the N-layer (N) along an edge thereof so that the P-connection electrode serves as a reflector for P-direction emission, and the N-connection electrode serves as a reflector for N-direction emission.

7. The dual emission LED chip of claim 6, wherein the P-direction connection unit includes a P-direction encapsulant layer provided in a space surrounded by the upper surface of the P-layer (P) and the P-connection electrode to protect the P-layer (P) and convert a P-direction emission color, and the N-direction connection unit includes an N-direction encapsulant layer provided in a space surrounded by an upper surface of the N-layer (N) and the N-connected electrode to protect the N-layer (N) and convert an N-direction emission color.

8. The dual emission LED chip of claim 1, wherein a P-direction insulating part formed as a film having a predetermined thickness is provided on an outer surface of the P-N junction and an edge of the upper surface of the P-layer (P), and an N-direction insulating part formed as a film having a predetermined thickness is provided on a lower surface of the P-direction insulating part and an edge of the lower surface of the N-layer (N).

9. The dual emission LED chip of claim 1, further comprising a support metal part provided to be plated on outer surfaces of the P-N junction, the P-direction connection unit, and the N-direction connection unit.

10. A dual emission light-emitting diode (LED) chip comprising an LED chip which uses an electroluminescence effect of a P-N junction including a P-layer (P) and an N-layer (N) below the P-layer (P), wherein light is emitted in each of an upward direction of the P-layer (P) and a downward direction of the N-layer (N), wherein a P-direction insulating part formed as a film having a predetermined thickness is provided on an outer surface of the P-N junction and an edge of the upper surface of the P-layer (P), and wherein an N-direction insulating part formed as a film having a predetermined thickness is provided on a lower surface of the P-direction insulating part and an edge of the lower surface of the N-layer (N).

* * * * *